(12) United States Patent
Kim et al.

(10) Patent No.: US 10,777,628 B2
(45) Date of Patent: Sep. 15, 2020

(54) DISPLAY DEVICE

(71) Applicant: Samsung Display Co., Ltd., Yongin-si, Gyeonggi-do (KR)

(72) Inventors: Yang Wan Kim, Yongin-si (KR); Jae Yong Lee, Yongin-si (KR); Sun Ja Kwon, Yongin-si (KR); Hyun Ae Park, Yongin-si (KR); Byung Sun Kim, Yongin-si (KR); Su Jin Lee, Yongin-si (KR); Hyung Jun Park, Yongin-si (KR); Yu Jin Jeon, Yongin-si (KR)

(73) Assignee: Samsung Display Co., Ltd. (KR)

( * ) Notice: Subject to any disclaimer, the term of this patent is extended or adjusted under 35 U.S.C. 154(b) by 261 days.

(21) Appl. No.: 15/586,073

(22) Filed: May 3, 2017

(65) Prior Publication Data
US 2018/0006105 A1    Jan. 4, 2018

(30) Foreign Application Priority Data
Jul. 1, 2016   (KR) .................. 10-2016-0083704

(51) Int. Cl.
*G09G 3/30* (2006.01)
*H01L 27/32* (2006.01)
(Continued)

(52) U.S. Cl.
CPC ....... *H01L 27/3276* (2013.01); *G09G 3/3225* (2013.01); *G09G 3/3258* (2013.01);
(Continued)

(58) Field of Classification Search
CPC .. G09G 3/3225; G09G 3/3258; G09G 3/3266; G09G 2300/0408;
(Continued)

(56) References Cited

U.S. PATENT DOCUMENTS 7,564,452 B2   7/2009 Komiya
8,803,770 B2   8/2014 Jeong et al.
(Continued)

FOREIGN PATENT DOCUMENTS

CN   105405397 A   3/2016
EP     2674932 A1   12/2013
(Continued)

OTHER PUBLICATIONS

Office Action in connection with U.S. Appl. No. 15/666,795 dated Sep. 19, 2018, 24 pages.
(Continued)

*Primary Examiner* — Jennifer T Nguyen
(74) *Attorney, Agent, or Firm* — Innovation Counsel LLP

(57) ABSTRACT

Disclosed is a display device, including: a substrate including a pixel area and a peripheral area; pixels provided in the pixel area as a plurality of pixel rows and a plurality of pixel columns; data lines configured to provide a data signal; scan lines configured to provide a scan signal; first power lines configured to provide a power source to the pixel columns; and a second power line connected to the first power lines and disposed in the peripheral area. A scan line connected to an $i^{th}$ pixel row may apply a scan signal to the $i^{th}$ pixel row, and a branched line branched from the scan line may apply an initialization signal to a $k^{th}$ pixel row ($k \neq i$). A branched point of the scan line is disposed between a pixel most adjacent to the second power line of the $i^{th}$ pixel row and the second power line.

14 Claims, 12 Drawing Sheets

(51) Int. Cl.
   *G09G 3/3225* (2016.01)
   *G09G 3/3258* (2016.01)
   *G09G 3/3266* (2016.01)
   H01L 27/12 (2006.01)
(52) U.S. Cl.
   CPC ....... *G09G 3/3266* (2013.01); *H01L 27/3248* (2013.01); *H01L 27/3262* (2013.01); *H01L 27/3265* (2013.01); G09G 2300/0408 (2013.01); G09G 2300/0426 (2013.01); G09G 2300/0861 (2013.01); G09G 2310/0202 (2013.01); G09G 2310/0262 (2013.01); G09G 2310/0281 (2013.01); G09G 2320/0233 (2013.01); H01L 27/124 (2013.01); H01L 2251/5338 (2013.01)
(58) Field of Classification Search
   CPC ... G09G 2300/0426; G09G 2300/0861; G09G 2310/0202; G09G 2310/0262; H01L 27/3248; H01L 27/3262; H01L 27/3265
   USPC .................... 345/76, 98, 204, 212
   See application file for complete search history.

(56) References Cited

U.S. PATENT DOCUMENTS

| | | | |
|---|---|---|---|
| 8,816,362 | B2 | 8/2014 | Choi |
| 8,907,870 | B2 | 12/2014 | Kang et al. |
| 9,092,080 | B2 | 7/2015 | Hyeon et al. |
| 9,208,727 | B2 | 12/2015 | Lee et al. |
| 9,224,329 | B2 | 12/2015 | Kim et al. |
| 9,224,972 | B2 | 12/2015 | Shin |
| 9,349,782 | B2 | 5/2016 | Hong |
| 9,378,675 | B2 | 6/2016 | Kim et al. |
| 9,412,299 | B2 | 8/2016 | Miyazawa et al. |
| 9,548,026 | B2 | 1/2017 | Jang |
| 9,741,287 | B2 | 8/2017 | Na et al. |
| 9,747,839 | B2 | 8/2017 | Wang et al. |
| 9,786,229 | B2 | 10/2017 | Lee et al. |
| 9,792,853 | B2 | 10/2017 | Jeon |
| 9,972,242 | B2 | 5/2018 | Lim et al. |
| 10,032,413 | B2 | 7/2018 | Kim et al. |
| 10,140,919 | B2 | 11/2018 | Nonaka et al. |
| 10,319,306 | B2 | 6/2019 | Jeong et al. |
| 10,431,154 | B2 | 10/2019 | Tsai et al. |
| 2005/0259142 | A1 | 11/2005 | Kwak |
| 2006/0244695 | A1 | 11/2006 | Komiya |
| 2007/0103406 | A1 | 5/2007 | Kim |
| 2008/0143651 | A1 | 6/2008 | Choi et al. |
| 2008/0218455 | A1 | 9/2008 | Yamamoto et al. |
| 2009/0102758 | A1 | 4/2009 | Anzai et al. |
| 2009/0189835 | A1 | 7/2009 | Kim et al. |
| 2010/0020059 | A1 | 1/2010 | Suh |
| 2010/0156945 | A1* | 6/2010 | Yoshida ............... G02F 1/1345 345/690 |
| 2010/0265166 | A1* | 10/2010 | Kang ................... G09G 3/3233 345/76 |
| 2011/0025659 | A1 | 2/2011 | Kwak et al. |
| 2011/0227098 | A1 | 9/2011 | Choi |
| 2012/0050234 | A1* | 3/2012 | Jang ..................... G09G 3/3225 345/204 |
| 2012/0075251 | A1 | 3/2012 | Yamauchi |
| 2013/0088417 | A1 | 4/2013 | Kim et al. |
| 2013/0201172 | A1 | 8/2013 | Jeong et al. |
| 2013/0257839 | A1 | 10/2013 | Hyeon et al. |
| 2013/0328853 | A1 | 12/2013 | Hong |
| 2014/0027719 | A1 | 1/2014 | Kim |
| 2014/0070184 | A1 | 3/2014 | Shin |
| 2014/0168188 | A1 | 6/2014 | Jun et al. |
| 2014/0347347 | A1 | 11/2014 | Jeong et al. |
| 2014/0353608 | A1 | 12/2014 | Kim et al. |
| 2015/0054812 | A1 | 2/2015 | Jeon |
| 2015/0061538 | A1 | 3/2015 | Miyazawa et al. |
| 2015/0187279 | A1 | 7/2015 | Lee et al. |
| 2015/0294618 | A1 | 10/2015 | Park et al. |
| 2015/0348462 | A1 | 12/2015 | Ma |
| 2015/0356920 | A1 | 12/2015 | Na et al. |
| 2016/0161783 | A1 | 6/2016 | Kim |
| 2016/0267843 | A1 | 9/2016 | Wang et al. |
| 2016/0351124 | A1 | 12/2016 | Kim et al. |
| 2016/0372037 | A1 | 12/2016 | Lim et al. |
| 2017/0032751 | A1* | 2/2017 | Jung ..................... G09G 3/3648 |
| 2017/0110054 | A1 | 4/2017 | Sun et al. |
| 2017/0365214 | A1 | 12/2017 | Tsai et al. |
| 2017/0365218 | A1 | 12/2017 | Jeong et al. |
| 2018/0006105 | A1 | 1/2018 | Kim et al. |
| 2018/0061324 | A1 | 3/2018 | Kim et al. |
| 2018/0068621 | A1 | 3/2018 | Lee et al. |
| 2018/0122297 | A1 | 5/2018 | Nonaka et al. |

FOREIGN PATENT DOCUMENTS

| | | |
|---|---|---|
| EP | 3258463 A1 | 12/2017 |
| EP | 3273436 A2 | 1/2018 |
| KR | 10-1152466 B1 | 6/2012 |
| KR | 10-2014-0025149 A | 3/2014 |
| KR | 10-2014-0134046 A | 11/2014 |
| KR | 10-2015-0064543 A | 6/2015 |
| KR | 10-2016-0069043 A | 6/2016 |
| KR | 10-2017-0143049 A | 12/2017 |
| KR | 10-2018-0023098 A | 3/2018 |

OTHER PUBLICATIONS

Office Action in connection with U.S. Appl. No. 15/601,012 dated Jul. 16, 2018, 13 pages.
European Search Report, Application No. 17179122.1, dated Dec. 8, 2017, pp. 1-19.
Office Action in connection with U.S. Appl. No. 15/666,795 dated Jan. 23, 2019, 21 pages.
Notice of Allowance in connection with U.S. Appl. No. 15/601,012 dated Jan. 24, 2019, 9 pages.
U.S. Office Action corresponding to U.S. Appl. No. 15/666,795 dated Jul. 3, 2019 20 pages.
European Communication corresponding to European Patent Application No. 17176242.0 dated Jan. 17, 2020 12 pages.

* cited by examiner

DISPLAY DEVICE

CROSS-REFERENCE TO RELATED APPLICATION

This application claims priority to and the benefit of Korean Patent Application No. 10-2016-0083704, filed on Jul. 1, 2016, in the Korean Intellectual Property Office, the entire contents of which are incorporated herein by reference in their entirety.

BACKGROUND

1. Field

The present disclosure relates to a display device.

2. Description of the Related Art

Generally, an organic light emitting display includes an anode electrode, a cathode electrode, and an organic light emitting layer positioned between the anode electrode and the cathode electrode. In the organic light emitting display, holes injected from the anode electrode and electrons injected from the cathode electrode are combined in the organic light emitting layer to form excitons, which emit energy as light.

The organic light emitting display includes a plurality of pixels including organic light emitting diodes, which are self-emitting devices. Lines and one or more thin film transistors, which are connected to the lines and drive the organic light emitting diode, are formed in each pixel.

The organic light emitting display includes a scan driver, a light emission driver, and a data driver for driving the pixels. Here, the drivers may be disposed in a peripheral area outside a pixel area in which the pixels of the organic light emitting display are disposed (i.e., not disposed in the pixel area). When the drivers are disposed in the peripheral area, a dead space of the organic light emitting display is increased.

SUMMARY OF THE DISCLOSURE

The present disclosure has been made in an effort to solve the above-described problems associated with the prior art and provides a display device in which a dead space may be minimized.

An exemplary embodiment of the present disclosure provides a display device including: a substrate including a pixel area and a peripheral area; pixels provided in the pixel area of the substrate, and disposed in a plurality of pixel rows and a plurality of pixel columns; data lines configured to provide a data signal to the pixel columns; scan lines configured to provide a scan signal to the pixel rows; emission control lines configured to provide an emission control signal to the pixel rows; first power lines configured to provide a power source to the pixel columns; and a second power line connected to the first power lines and disposed in the peripheral area. Here, a scan line connected to an $i^{th}$ pixel row (i is a natural number) may apply a scan signal to the $i^{th}$ pixel row, and a branched line branched from the scan line may apply an initialization signal to a $k^{th}$ pixel row (k is a natural number, and k≠i). A branched point of the scan line may be disposed between a pixel (hereinafter, referred to as a "leading pixel") that is most adjacent to the second power line of the $i^{th}$ pixel row, and the second power line. The $k^{th}$ pixel row, to which the scan line applies the initialization signal, may be an $i+1^{th}$ pixel row.

The pixel area may include a first pixel area and a second pixel area disposed on at least one side of the first pixel area.

A width of a portion of the second pixel area decreases as the distance between the portion of second pixel area and the first pixel area increases.

In the second pixel area, the branched point of the scan line connected to an $l^{th}$ pixel row (l is a natural number) may be disposed between a data line connected to a leading pixel of a pixel row that is different from the $l^{th}$ pixel row and a leading pixel of the $l^{th}$ pixel row. The different pixel row may be more adjacent to the first pixel area than the $l^{th}$ pixel row.

The display device may further include a scan driver provided in the peripheral area and connected to ends of the scan lines; and an emission driver provided in the peripheral area and connected to ends of the emission control lines. Here, the scan driver may be disposed between the emission driver and the pixel area.

The display device may further include: a first initialization power line provided in the peripheral area and configured to provide a first initialization power source to the pixel rows; and a second initialization power line provided in the peripheral area and configured to provide a second initialization power source to the pixel rows. The first initialization power line and the second initialization power line may be disposed between the scan driver and the pixel area.

A voltage of a power source applied to the first initialization power line may be higher than a voltage of a power source applied to the second initialization power line.

The pixel may include an emitting device including an anode electrode, a cathode electrode, and an emission layer disposed between the anode electrode and the cathode electrode, and the voltage of the power source applied to the second initialization power line may be higher than a voltage of a power source applied to the cathode electrode.

The voltage of power source applied to the first initialization power line may be lower than a voltage of the data signal applied to the data lines.

In the first pixel area, lengths of branched lines branched from the scan lines may be the same.

In the second pixel area, a length of the branched line branched from the scan line connected to at least a part of the pixel rows may be different from a length of a branched line branched from a scan line of another pixel row.

In the second pixel area, when a distance between the pixel row and the first pixel area is increased, the length of the branched line may be increased.

Another exemplary embodiment of the present disclosure provides a display device, including: a substrate including a pixel area and a peripheral area; pixels provided in the pixel area of the substrate, and disposed in a plurality of pixel rows and a plurality of pixel columns; data lines configured to provide a data signal to the pixel columns; scan lines configured to provide a scan signal applied from a scan driver to the pixel rows; emission control lines configured to provide an emission control signal applied from an emission driver to the pixel rows; first power lines configured to provide a power source to the pixel columns, respectively; a second power line connected to the first power lines and disposed in the peripheral area; and a gate insulating layer, a first interlayer insulating layer, a second interlayer insulating layer, and a third interlayer insulating layer, which are sequentially laminated on the substrate. The scan line may include: a scan driving connecting unit disposed on the first interlayer insulating layer, and connected to the scan driver in the peripheral area; a first pixel connecting unit disposed on the gate insulating layer and connected to one pixel row; a scan line connecting unit disposed on the third interlayer insulating layer and configured to connect the scan driving connecting unit and the first pixel connecting unit; and a signal connecting unit disposed on the second interlayer insulating layer, connected to the scan driving connecting unit through a contact hole, and extended in a direction crossing the first pixel connecting unit. A scan line connected to an $i^{th}$ pixel row (i is a natural number) may apply a scan signal to the $i^{th}$ pixel row through the first pixel connecting unit, and apply an initialization signal to a $k^{th}$ pixel row (k is a natural number, and k≠i) through the signal connecting unit. The contact hole may be disposed between a pixel (hereinafter, referred to as a "leading pixel") that is most adjacent to the second power line of the $i^{th}$ pixel row and the second power line.

The display device may further include an another pixel connecting unit connected to the signal connecting unit and a leading pixel of the $k^{th}$ pixel row. The another pixel connecting unit may be disposed on the gate insulating layer. The data line may be disposed on a first interlayer insulating layer, and the first power line and the second power line may be disposed on the second interlayer insulating layer.

The emission control line may include: an emission driving connecting unit disposed on the gate insulating layer, and connected to the emission driver; a second pixel connecting unit disposed on the gate insulating layer and connected to the pixel; and an emission control line connecting unit disposed on the third interlayer insulating layer, and configured to connect the emission driving connecting unit and the second pixel connecting unit.

Each of the first initialization power line and the second initialization power line may be connected to lines. The lines may include: a first connection line disposed on a first interlayer insulating layer, and connected to the first initialization power line or the second initialization power line; a second connection line disposed on the first interlayer insulating layer and connected to the pixel row; and a third connection line disposed on the third interlayer insulating layer, and connected to the first connection line and the second connection line.

According to the exemplary embodiment of the present disclosure, it is possible to decrease the number of lines disposed in the peripheral area of the display device. Accordingly, a dead space of the display device may be minimized.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided to convey the scope of the example embodiments to those skilled in the art.

In the drawing figures, dimensions may be exaggerated for clarity of illustration. It will be understood that when an element is referred to as being "between" two elements, it may be the only element between the two elements, or one or more intervening elements may also be present. Like reference numerals refer to like elements throughout.

DETAILED DESCRIPTION OF THE INVENTION

Figure 1:
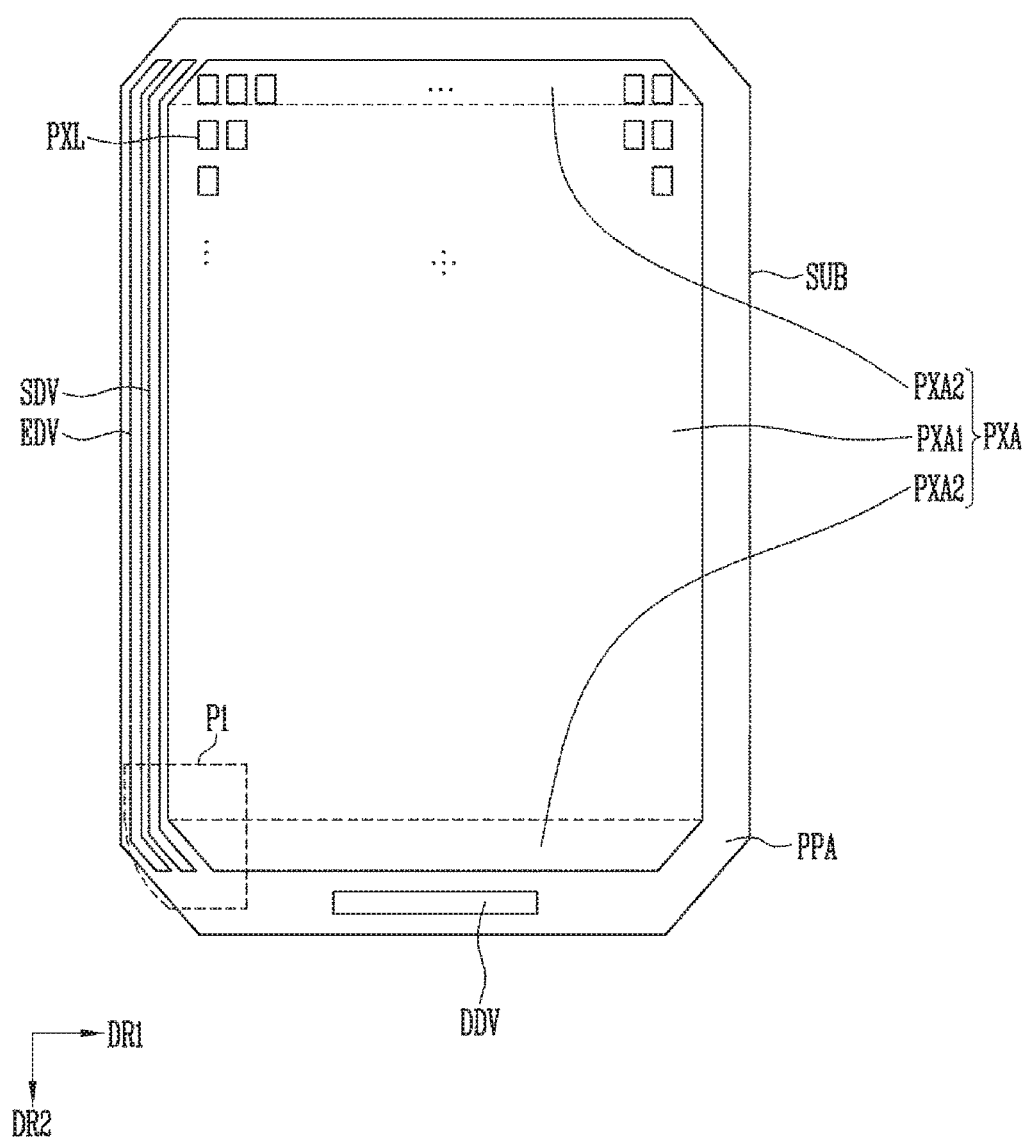
FIG. 1 is a top plan view illustrating a display device according to an exemplary embodiment of the present disclosure.

Although specific exemplary embodiments are illustrated in the drawings and described in detail in the text, the present disclosure may be variously modified and have various forms. Thus, it should be understood that the invention is not limited to the specific embodiments, but includes all changes, equivalents, or alternatives that are included in the spirit and technical scope of the present disclosure.

In the description of respective drawings, similar reference numerals designate similar elements. In the accompanying drawings, sizes of structures are illustrated to be enlarged compared to actual sizes for clarity of the present disclosure. Terms "first", "second", and the like may be used for describing various constituent elements, but the constituent elements should not be limited to the terms. The terms are used only to discriminate one constituent element from another constituent element. For example, a first element could be termed a second element, and similarly, a second element could be also termed a first element without departing from the scope of the present disclosure. As used herein, the singular forms are intended to include the plural forms as well, unless the context clearly indicates otherwise.

In the present disclosure, it should be understood that terms "include" or "have" indicate that a feature, a number, a step, an operation, a component, a part or the combination thoseof described in the specification is present, but do not exclude a possibility of presence or addition of one or more other features, numbers, steps, operations, components, parts or combinations, in advance. It will be understood that when an element such as a layer, film, region, or substrate is referred to as being "on" another element, it can be directly on the other element or intervening elements may also be present. Further, in the present disclosure, when a part of a layer, a film, an area, a plate, and the like is formed on another part, a direction in which the part is formed is not limited only to an up direction, and includes a lateral direction or a down direction. On the contrary, it will be understood that when an element such as a layer, film, region, or substrate is referred to as being "beneath" another element, it may be directly beneath the other element, or intervening elements may also be present.

Hereinafter, an exemplary embodiment of the present disclosure will be described in detail in more detail with reference to the accompanying drawings.

FIG. 1 is a top plan view illustrating a display device according to an exemplary embodiment of the present disclosure.

Referring to FIG. 1, a display device according to an exemplary embodiment of the present disclosure includes a substrate SUB, pixels PXL provided on the substrate SUB, a driver provided on the substrate SUB and driving the pixels PXL, and a wiring unit (not illustrated) connecting the pixels PXL and the driver.

The substrate SUB may have a pixel area PXA and a peripheral area PPA. The pixel area PXA is an area in which the pixels PXL displaying an image are provided. The pixels PXL will be described below. The peripheral area PPA is an area in which the pixels PXL are not provided and an image is not displayed. The peripheral area PPA may include the driver driving the pixels PXL and a part of wires connecting the pixels PXL and the driver. The peripheral area PPA corresponds to a bezel in the display device, and a width of the bezel may be determined according to a width of the peripheral area.

The pixel area PXA may have various shapes. For example, the pixel area PXA may be provided in various shapes, such as a polygon having a closed shape including a straight side, a circle or an ellipse including a curved side, and a semicircle or a half ellipse including a side formed of a straight line and a curved line. If the pixel area PXA includes a plurality of areas, each area may also be provided in various shapes, such as a polygon having a closed shape including a straight side, a circle or an ellipse including a curved side, and a semicircle or a half ellipse including a side formed of a straight line and a curved line PPA.

In the exemplary embodiment of the present disclosure, the pixel area PXA may include a first pixel area PXA1 and two second pixel areas PXA2. The second pixel areas PXA2 may be disposed at both facing sides of the first pixel area PXA1. The second pixel areas PXA2 may have a shape in which, the farther a portion of the second pixel area PXA2 is from the first pixel area PXA1, the smaller a width the portion has. For example, the second pixel areas PXA2 may have a trapezoid shape in which the width of its portions progressively decreases as the distance between the portions and the first pixel area PXA1 increases.

The peripheral area PPA may be provided at least on one side of the pixel area PXA. In the exemplary embodiment of the present disclosure, the peripheral area PPA may surround a perimeter of the pixel area PXA. In the exemplary embodiment of the present disclosure, the peripheral area PPA may include a horizontal portion extended in a width direction and a vertical portion extended in a longitudinal direction. A pair of vertical portions of the peripheral area PPA, which are spaced apart from each other in the width direction of the pixel area PXA, may be provided.

The pixels PXL may be provided within the pixel area PXA on the substrate SUB, wherein each pixel PXL is a minimum unit displaying an image. The pixel PXL may include an organic light emitting device emitting white light and/or color light. Each pixel PXL may emit any one color among red, green, and blue, but is not limited thereto. For example, the pixel PXL may also emit one color among cyan, magenta, yellow, and white.

The plurality of pixels PXL may be provided and arranged in a matrix form along a row extended in a first direction DR1 and a column extended in a second direction DR2. However, the arrangement form of the pixels PXL is not particularly limited, and the pixels PXL may be arranged in various forms. For example, some of the pixels PXL may be arranged along the first direction DR1 (e.g., the row direction), and other pixels PXL may be arranged along another direction different from the first direction DR1, for example, a direction slanted (e.g., not orthogonal) with respect to the first direction DR1.

The driver provides a signal to each pixel PXL through the wiring unit, and thus, controls the driving of the pixel PXL. The wiring unit is omitted in FIG. 1 for convenience of the description, and the wiring unit will be described below.

The driver may include a scan driver SDV providing a scan signal to the pixel PXL through a scan line, an emission driver EDV providing an emission control signal to the pixel PXL through an emission control line, a data driver DDV providing a data signal to the pixel PXL through a data line, and a timing controller (not illustrated). The timing controller controls the scan driver SDV, the emission driver EDV, and the data driver DDV.

The scan driver SDV may be disposed in the vertical portion of the peripheral area PPA. The peripheral area PPA is provided with the pair of vertical portions which are spaced apart from each other in the width direction of the pixel area PXA, and the scan driver SDV may be disposed in at least one of the vertical portions of the peripheral area PPA. The scan driver SDV may be elongated in the longitudinal direction of the peripheral area PPA.

In the exemplary embodiment of the present disclosure, the scan driver SDV may be directly mounted on the substrate SUB. When the scan driver SDV is directly mounted on the substrate SUB, the scan driver SDV may be formed together with the pixels PXL during a process of forming the pixels PXL. However, the position in which the scan driver SDV is provided and the method of providing the scan driver SDV are not limited thereto. For example, in other embodiments, the scan driver SDV may be formed in a separate chip and provided on the substrate SUB as a chip-on-glass, or may be mounted on a printed circuit board and connected to the substrate SUB through a connecting member.

The emission driver EDV may also be disposed in the vertical portion of the peripheral area PPA, similar to the scan driver SDV. The emission driver EDV may be disposed in at least one of the vertical portions of the peripheral area PPA. The emission driver EDV may be elongated in the longitudinal direction of the peripheral area PPA.

In the exemplary embodiment of the present disclosure, the emission driver EDV may be directly mounted on the substrate SUB. When the emission driver EDV is directly mounted on the substrate SUB, the emission driver EDV may be formed together with the pixels PXL during a process of forming the pixels PXL. However, the position in which the emission driver EDV and the method of providing the emission driver EDV are not limited thereto. For example, the emission driver EDV may be formed in a separate chip and provided on the substrate SUB as a chip-on-glass, or may be mounted on a printed circuit board and connected to the substrate SUB through a connecting member.

In the exemplary embodiment of the present disclosure, it is illustrated as an example that the scan driver SDV and the emission driver EDV are adjacent to each other, and are formed at only one of the pair of vertical portions of the peripheral area PPA, but the present disclosure is not limited thereto, and the disposition of the scan driver SDV and the emission driver EDV may be changed in various scheme. For example, the scan driver SDV may be provided at one side of the vertical portions of the peripheral area PPA, and the emission driver EDV may be provided at the other side of the vertical portions of the peripheral area PPA. As another example, the scan driver SDV may be provided at both sides of the vertical portions of the peripheral area PPA, and the emission driver EDV may be provided at only one side of the vertical portions of the peripheral area PPA.

The data driver DDV may be disposed in the peripheral area PPA. Particularly, the data driver DDV may be disposed in the horizontal portion of the peripheral area PPA. The data driver DDV may be elongated in the width direction of the peripheral area PPA.

In the exemplary embodiment of the present disclosure, the positions of the scan driver SDV, the emission driver EDV, and/or the data driver DDV may be changed.

The timing controller (not illustrated) may be connected to the scan driver SDV, the emission driver EDV, and the data driver DDV through the lines by various schemes. The disposition position of the timing controller is not particularly limited. For example, the timing controller may be mounted on a printed circuit board and connected with the scan driver SDV, the emission driver EDV, and the data driver DDV through the flexible printed circuit board, and the printed circuit board may be disposed at various positions, such as on one side of the substrate SUB or a rear surface of the substrate SUB.

Figure 2:
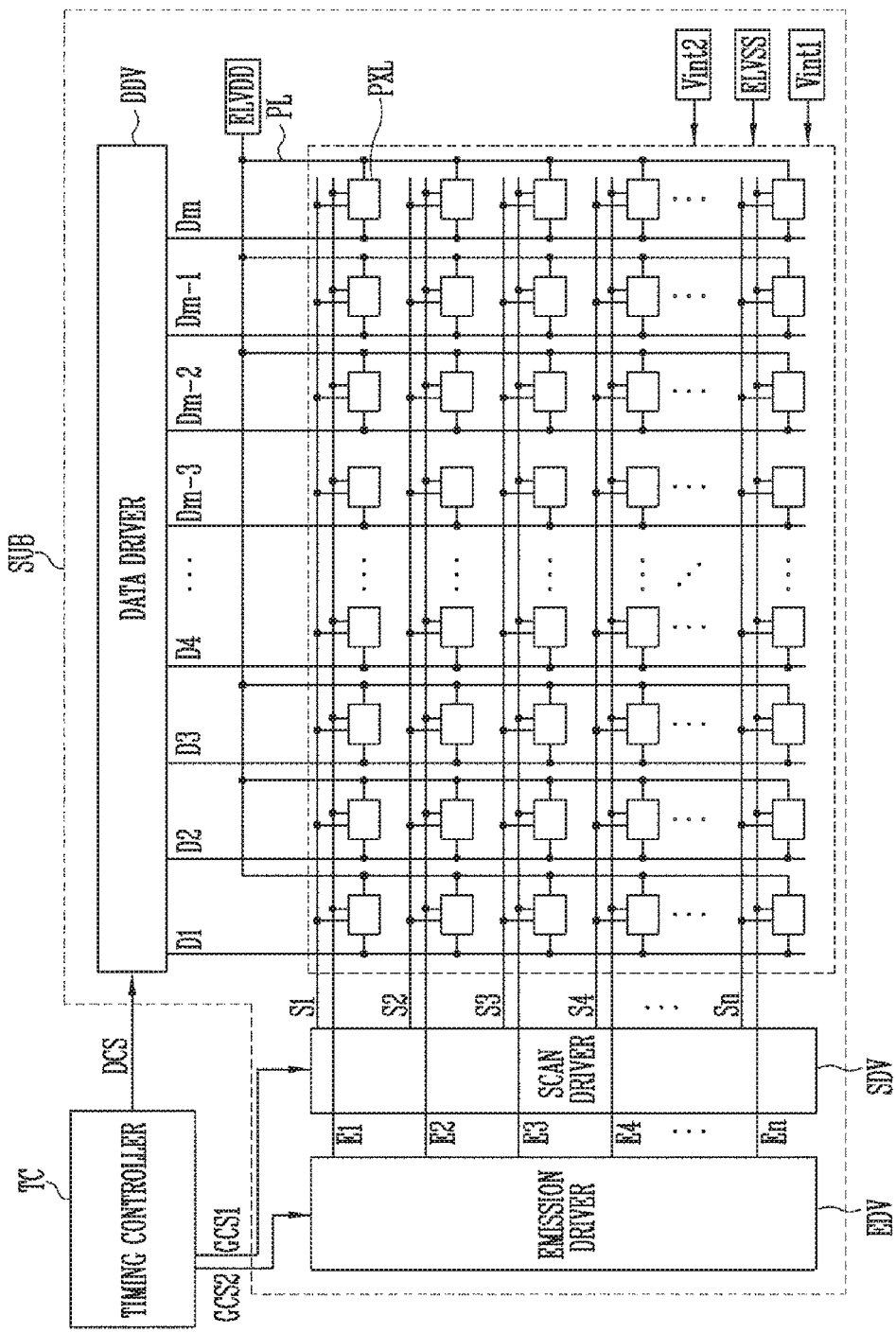
FIG. 2 is a block diagram illustrating pixels and a driver according to an exemplary embodiment of the present disclosure.

FIG. 2 is a block diagram illustrating pixels and a driver according to an exemplary embodiment of the present disclosure.

Referring to FIG. 2, a display device according to an exemplary embodiment of the present disclosure may include pixels PXL, a driver, and a wiring unit.

The plurality of pixels PXL may be provided. The driver may include a scan driver SDV, an emission driver EDV, a data driver DDV, and a timing controller TC. In FIG. 2, the positions of the scan driver SDV, the emission driver EDV, the data driver DDV, and the timing controller TC are set for convenience of the description. In actual implementation, the scan driver SDV, the emission driver EDV, the data driver DDV, and the timing controller TC may be disposed at other positions within the display device.

The wiring unit provides a signal to each pixel PXL from the driver, and may include scan lines, data lines, emission control lines, a power line PL, a first initialization power line Vint1, and a second initialization power line Vint2. The scan lines may include a plurality of scan lines S1 to Sn, and the emission control lines may include a plurality of emission control lines E1 to En. The data lines D1 to Dm and the power line PL may be connected to each pixel PXL.

The pixels PXL may be disposed in a pixel area PXA. The pixels PXL may be connected to the scan lines S1 to Sn, the emission control lines E1 to En, the data lines D1 to Dm, and the power line PL. When a scan signal is supplied from the scan lines S1 to Sn, the pixels PXL may receive a data signal from the data lines D1 to Dm.

Further, the pixels PXL may receive a first power source ELVDD, a second power source ELVSS, a first initialization power source Vint1, and a second initialization power source Vint2. Here, the first power source ELVDD may be applied through the power line PL.

Each of the pixels PXL may include a driving transistor and an organic light emitting diode, which are not illustrated.

The driving transistor may control the quantity of current flowing from the first power source ELVDD to the second power source ELVSS via the organic light emitting diode in response to the data signal. Here, a gate electrode of the driving transistor may be initialized by a voltage of the first initialization power source Vint1 before the data signal is supplied. To this end, the first initialization power source Vint1 may be set with a lower voltage than the data signal.

Further, when the data signal is supplied, an anode electrode of the organic light emitting diode may be initialized by the second initialization power source Vint2. Here, the second initialization power source Vint2 may be set with a lower voltage than that of the first initialization power source Vint1. Further, the second initialization power source Vint2 may be set with a higher voltage than that of the second power source ELVSS.

The scan driver SDV may supply a scan signal to the scan lines S1 to Sn in response to a first gate control signal GCS1 from the timing controller TC. For example, the scan driver SDV may sequentially supply a scan signal to the scan lines S1 to Sn. When the scan signal is sequentially supplied to the scan lines S1 to Sn, the pixels PXL may be sequentially selected in a unit of a horizontal line.

The emission driver EDV may supply an emission control signal to the emission control lines E1 to En in response to a second gate control signal GCS2 from the timing controller TC. For example, the emission driver EDV may sequentially supply an emission control signal to the emission control lines E1 to En.

Here, a duration of the emission control signal may be set to be a longer than that of the scan signal. For example, an emission control signal supplied to an $i^{th}$ emission control line Ei (i is a natural number) may be supplied so as to overlap a scan signal supplied to an scan line Si-1 and a scan signal supplied to an $i^{th}$ scan line Si by at least a part time period.

In addition, the emission control signal may be set with a gate off voltage (for example, a voltage with a high level) so that the transistors included in the pixels PXL may be turned off, and the scan signal may be set with a gate on voltage (for example, a voltage with a low level) so that the transistors included in the pixels PXL may be turned on.

The data driver DDV may supply a data signal to the data lines D1 to Dm in response to a data control signal DCS. In turn, the data lines D1 to Dm may supply the data signal to the pixels PXL according to a scan signal.

The timing controller TC may supply gate control signals GCS1 and GCS2, which are generated based on timing signals supplied from the outside, to the san drivers SDV and the emission drivers EDV, and supply a data control signal DCS to the data driver DDV.

Each of the gate control signals GCS1 and GCS2 may include a start pulse and clock signals. The start pulse may control a timing of the first scan signal or the first emission control signal. The clock signals may be used for shifting the start pulse.

The data control signal DCS may include a source start pulse and clock signals. The source start pulse may control a sampling start time point of data. The clock signals may be used for controlling a sampling operation.

Figure 3:
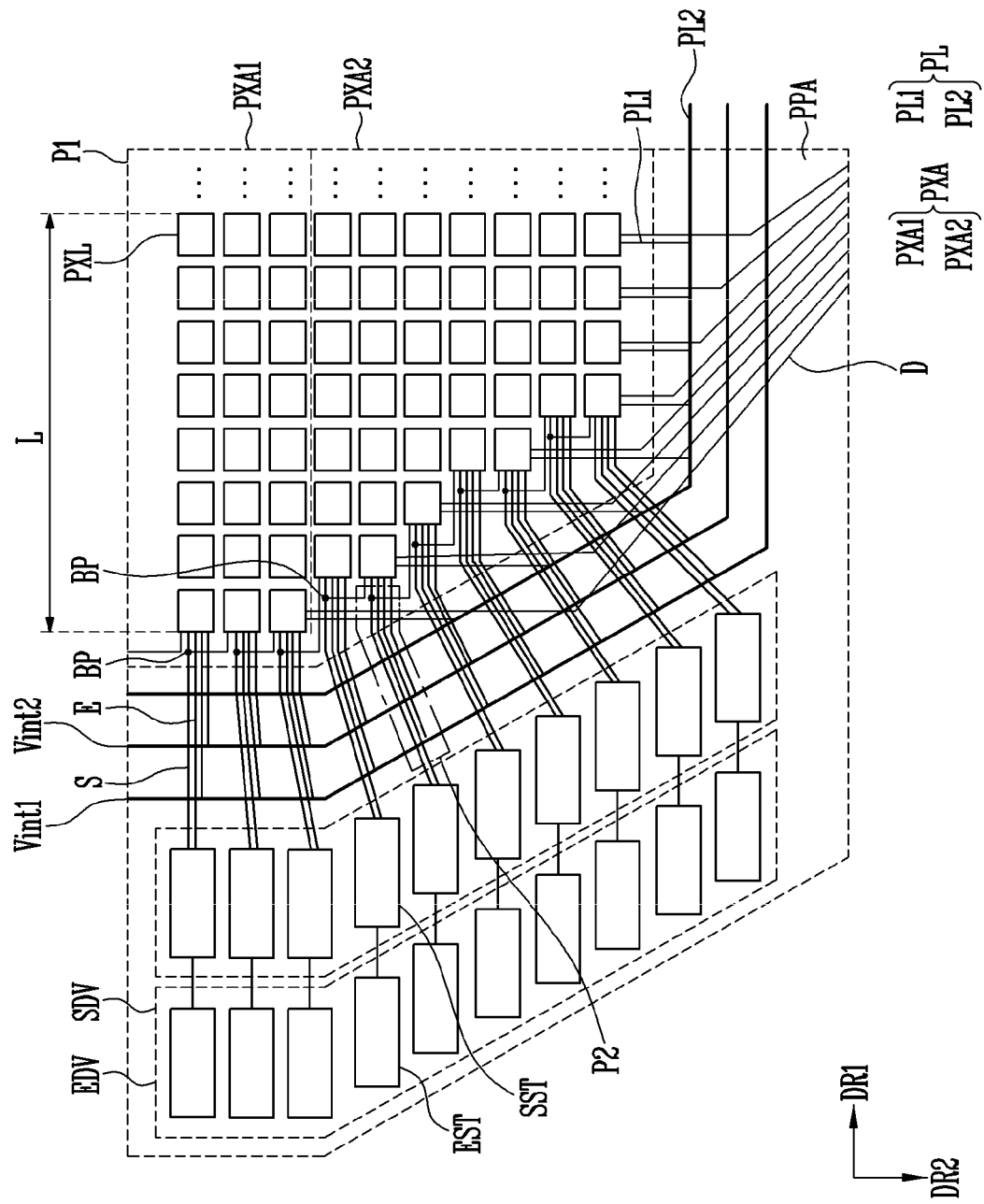
FIG. 3 is a top plan view conceptually illustrating a part corresponding to P1 of FIG. 1.

FIG. 3 is a top plan view conceptually illustrating a part corresponding to P1 of FIG. 1, and illustrates a connection relation between the pixels, the wiring unit, and the driver. An area indicated with P1 in FIG. 1 is a part of a lower end of the pixel area and a part of the lower end of the peripheral area.

In FIG. 3, for convenience of the description of a connection relation between the respective lines, one of the scan lines S connected to one pixel PXL and an emission control line E are illustrated as an example. Further, only a part of the data lines and the power lines is illustrated. In particular, a data line D is illustrated, a first power line PL1 is illustrated, and a second power line PL2 is illustrated. Here, only a part of the wiring units is illustrated, but scan lines, emission control lines, data lines, power lines, and a first initialization power line and a second initialization power line, which are not illustrated, may be further provided by a scheme to be described below.

Referring to FIG. 3, a substrate may be divided into a pixel area PXA and a peripheral area PPA, and the pixels PXL may be disposed within the pixel area PXA.

The pixels PXL may include a plurality of pixel rows arranged one by one in the second direction DR2 so as to be parallel to each other along the second direction DR2, and each pixel row may be extended in the first direction DR1. The pixels PXL may include a plurality of pixel columns arranged one by one in the first direction DR1 so as to be parallel to each other along the first direction DR1, and each pixel column may be extended in the second direction DR2. That is, the pixels PXL may be disposed in a predetermined matrix form. The pixels PXL will be described below.

A first pixel area PXA1 of the pixel area PXA may have the same number of pixels of the respective pixel rows, and may have the same length as a length of each pixel row in the first direction DR1.

A second pixel area PXA2 in the pixel area PXA may have the decreased number of pixels configuring each pixel row in the second direction DR2. For example, the farther a pixel row in the second pixel area PXA2 is from the first pixel area PXA1, the smaller the number of pixels may be in the pixel row. Accordingly, the number of pixels PXL provided in each pixel row in the second pixel area PXA2 may be varied. In the second pixel area PXA2, the pixel row that is more adjacent to the first pixel area PXA1 may have the larger number of pixels PXL.

For convenience of the description, only one side portion of the pixel area PXA is illustrated, but the other side portion may also be substantially formed by the same scheme such that a shape of the pixel area PXA is bilaterally symmetric. Here, a length L of the pixel row arranged in each pixel area is decreased in the second direction DR2, but the length does not need to be decreased in the same rate (or the number of pixels arranged in the pixel row does not need to be decreased in the same rate), and the number of pixels arranged in each pixel row of the second pixel area PXA2 may be variously changed.

The driver may be disposed within the peripheral area PPA, and the wiring unit may connect the pixels PXL and the driver.

The driver includes a scan driver SDV connected with the pixels PXL through scan lines S. The scan driver SDV may be provided to be adjacent to the pixel area PXA.

The scan driver SDV according to the exemplary embodiment of the present disclosure may include a plurality of scan stages SST. Each of the scan stages SST may be connected to any one of the scan lines S. The scan lines S may connect an output terminal of the scan stage SST and a scan signal input terminal of an outermost pixel of a pixel row, and the scan stages SST may be driven in response to a clock signal. The scan stages SST may be substantially implemented using the same circuit.

The scan driver SDV may have a shape corresponding to a shape of the first pixel area PXA1 and the second pixel area PXA2. That is, an area of the scan driver SDV corresponding to the second pixel area PXA2 may have an inclined shape. The scan driver SDV may be extended along a border of the pixel area PXA. For example, the scan stages SST may be arranged along the border of the pixel area PXA. Accordingly, a virtual line connecting one end of each of the scan stages SST may be slanted at a predetermined degree of inclination.

Each of the scan stages SST may correspond to a pixel row included in the pixel area PXA, and supply a scan signal to the pixels PXL arranged in the corresponding pixel row.

The scan lines S provided in the pixel area PXA may be parallel with respect to the first direction DR1. That is, the output terminal of the scan stage SST and the scan signal input terminal of the outermost pixel of the pixel row may have the same position in the second direction DR2.

The scan lines S provided in the peripheral area PPA may be parallel with respect to the first direction DR1, or may be slanted with respect to the first direction DR1. The peripheral area PPA is provided in a form surrounding the pixel area PXA, such that a portion corresponding to the second pixel area PXA2 of the peripheral area PPA may have an inclined shape. Accordingly, the scan stages SST corresponding to the second pixel area PXA2 may be arranged along the inclined portion of the peripheral area PPA. As a result, the scan lines S provided in the peripheral area PPA corresponding to the second pixel area PXA2 may be bent in a predetermined area, and may have an angle inclined with respect to the first direction DR1. The reason is that the output terminal of the scan stages SST and the scan signal input terminal of the outermost pixel of the pixel row have different positions along the second direction DR2.

The driver may include an emission driver EDV connected with the pixels PXL, and the emission driver EDV may be provided to be adjacent to the scan driver SDV. The scan driver SDV may be positioned between the emission driver EDV and the pixel area PXA, and thus, the emission driver EDV may be disposed farther from the pixel area PXA than the scan driver SDV is from the pixel area PXA.

The emission driver EDV according to the exemplary embodiment of the present disclosure may include a plurality of emission stages EST. The emission control lines E may connect an output terminal of an emission stage EST and an emission signal input terminal of an outermost pixel of a pixel row, and the emission stages EST may be driven in response to a clock signal. The emission stages EST may be implemented using the same circuit.

The emission driver EDV may have a shape corresponding to a shape of the first pixel area PXA1 and the second pixel area PXA2. That is, an area of the emission driver EDV corresponding to the second pixel area PXA2 may have an inclined shape.

Each of the emission stages EST may correspond to a pixel row included in the pixel area PXA, and supply the emission control signal to the pixels PXL arranged in the corresponding pixel row.

The emission control lines E provided in the pixel area PXA may be parallel with respect to the first direction DR1. That is, the output terminal of the emission stage EST and the emission signal input terminal of the outermost pixel of the pixel row may have the same position in the second direction DR2.

The emission control lines E provided in the peripheral area PPA may be parallel with respect to the first direction DR1, or may be slanted with respect to the first direction DR1. Each of the emission control lines E provided in the peripheral area PPA have one end connected to the pixel PXL and the other end connected to the emission stage EST.

The area of the emission driver EDV corresponding to the second pixel area PXA2 has an inclined shape, such that the emission stages EST corresponding to the second pixel area PXA2 are also arranged along the inclined portion of the peripheral area PPA. As a result, the emission control lines E provided in the peripheral area PPA may be bent in a predetermined area, and may have an angle inclined with respect to the first direction DR1. The reason is that the output terminal of the emission stages EST and the emission signal input terminal of the outermost pixel of the pixel row have different positions along the second direction DR2.

For convenience of the description, FIG. 3 illustrates that the scan line S is connected to only the outermost pixel of each pixel row, but the scan line S may be connected to all of the pixels PXL provided in each pixel row. Likewise, the emission control line E may be connected to all of the pixels PXL provided in each pixel row.

Next, a data driver DDV (see FIG. 1) may be provided in the peripheral area PPA. A corresponding data line D may be connected to each of the pixel columns. The data lines D are connected to the data driver DDV. For convenience of the description, FIG. 3 illustrates that the data lines D are connected to only the outermost pixel of each pixel column, but each of the data lines D may be connected to all of the pixels PXL provided in each pixel column, and the pixels PXL of the same column may share the same data line D. The data lines D may be extended in the second direction DR2 within the pixel area PXA. The data lines D may be generally extended in the second direction DR2 within the peripheral area PPA. However, the data lines D may be bent in a predetermined area, and may be extended in a direction inclined with respect to the second direction DR2. The data lines D may be extended to be collected in a direction of the data driver DDV, and may configure a data line fan out unit having a shape spread from the data driver DDV in a pixel direction.

The wiring unit provides a signal from the driver to each pixel PXL, and includes the scan lines S, the data lines D, the emission control lines E, the power line PL, the first initialization power line Vint1, and the second initialization power line Vint2.

A corresponding power line may be connected to each of the pixel columns. The power line PL may include first power lines PL1 provided in the pixel area PXA and a second power line PL2 connected with the first power lines PL1 and provided in the peripheral area PPA.

The second power line PL2 may have a larger width than those of the first power lines PL1. The second power line PL2 may be extended along the border of the pixel area PXA. The first power lines PL1 may be branched from the second power line PL2 and may be connected to the pixel columns, respectively. The second power line PL2 may provide a first power source ELVDD (see FIG. 3) to the pixels PXL. For convenience of the description, FIG. 3 illustrates that the first power lines PL1 are connected to the outermost pixels of the pixel columns, but each of the first power lines PL1 may be connected to all of the pixels PXL provided in each pixel column, and the pixel in the same column may share the same first power line PL1.

Although not illustrated, according to the exemplary embodiment of the present disclosure, a line applying a second power source ELVSS (see FIG. 2) may be provided to an outer side of the emission driver EDV.

The first initialization power line Vint1 and the second initialization power line Vint2 may be connected to each of the pixel rows.

The first initialization power line Vint1 and the second initialization power line Vint2 may be extended along the border of the pixel area PXA in the peripheral area PPA. Further, the first initialization power line Vint1 and the second initialization power line Vint2 may be disposed between the second power line PL2 and the scan driver SDV.

The scan line S connected to each pixel row may be extended to the pixel area PXA. Further, the scan line S may be branched into two lines before being connected to the outermost pixel PXL of the pixel row, and one of the two lines may be connected to another pixel row different from the pixel row. The line connected to another pixel row may apply an initialization signal to another pixel row. That is, a scan signal may be applied to the pixel row and an initialization signal may be applied to another pixel row through one scan line S. For example, the scan line S connected to an $i^{th}$ pixel row (i is a natural number) may be branched into two lines before being connected to the pixel that is most adjacent to the scan driver SDV in the $i^{th}$ pixel row. One of the two lines may supply a scan signal to the $i^{th}$ pixel row, and another line (hereinafter, referred to as a "branched line") may be connected to the pixel PXL that is most adjacent to the scan driver SDV in the $i+1^{th}$ pixel row to supply an initialization signal to the $i+1^{th}$ pixel row.

Further, the scan line S is branched before being connected to the pixel PXL that is most adjacent to the scan driver SDV in the pixel row, such that a branched point BP of the scan line S may be adjacent to the pixel area PXA or may be provided within the pixel area PXA. For example, the branched point BP of the scan line S may be disposed between the pixel PXL that is most adjacent to the second power line in the pixel row and the second power line PL2.

When the branched point BP of the scan line S is disposed between the scan driver SDV and the first initialization power line Vint1, or between the scan driver SDV and the second initialization power line Vint2, the number of scan lines S disposed in the peripheral area PPA may be two. Accordingly, the number of scan lines S is increased in the peripheral area PPA, and a width of the peripheral area PPA may be increased.

However, in the present exemplary embodiment, because the branched point BP of the scan line S is adjacent to the pixel area PXA, or is provided within the pixel area PXA, the width of the peripheral area PPA may be prevented from being increased, or the width of the peripheral area PPA may be decreased.

A width of the first pixel area PXA1 is not changed according to a position of the first pixel area PXA1, and may be uniformly maintained. Accordingly, in the first pixel area PXA1, all of the lengths of the branched lines of the scan lines S may be the same.

A width of the second pixel area PXA2 may be changed according to a position of the second pixel area PXA2. Accordingly, in the second pixel area PXA2, the lengths of the branched lines branched from the scan lines S connected to at least a part of the pixel rows may be different from the length of the branched line branched from the scan line of another pixel row. For example, the lengths of the branched lines corresponding to the adjacent pixel rows may be different.

Next, the pixels PXL illustrated in FIG. 3 will be described.

Figure 4:
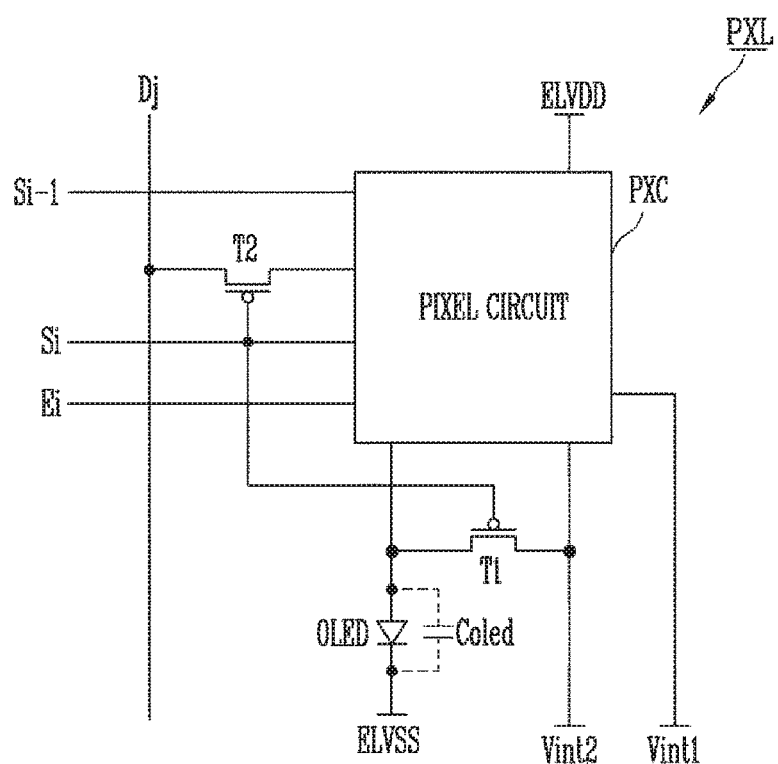
FIG. 4 is a diagram illustrating an exemplary embodiment of a pixel PXL illustrated in FIG. 3.

FIG. 4 is a diagram illustrating an exemplary embodiment of the pixel PXL illustrated in FIG. 3.

For convenience of the description, FIG. 4 illustrates a pixel connected to an $j^{th}$ data line Dj and an $i^{th}$ scan line Si.

Referring to FIG. 4, the pixel PXL according to the exemplary embodiment of the present disclosure may include a pixel circuit PXC, an organic light emitting device OLED, a first transistor T1, and a second transistor T2.

An anode electrode of the organic light emitting device OLED may be connected to the pixel circuit PXC, and a cathode electrode of the organic light emitting device OLED may be connected to a second power source ELVSS. The organic light emitting device OLED may generate light having predetermined brightness in response to the quantity of current supplied from the pixel circuit PXC.

The pixel circuit PXC may initialize a gate electrode of a driving transistor with a voltage of the first initialization power source Vint1 when a scan signal is supplied to an $i-1^{th}$ scan line Si-1. Further, the pixel circuit PXC may receive a data signal from a data line Dj via the second transistor T2 when a scan signal is supplied to an $i^{th}$ scan line Si. The pixel circuit PXC receiving the data signal may control the quantity of current flowing from a first power source ELVDD to the second power source ELVSS via the organic light emitting device OLED when the supply of an emission control signal to an $i^{th}$ emission control line Ei is stopped. The pixel circuit PXC may be implemented with various forms of circuit receiving a first initialization power source Vint1.

The first transistor T1 may be connected between the anode electrode of the organic light emitting device OLED and the second initialization power source Vint2. Further, a gate electrode of the first transistor T1 is connected to an $i^{th}$ scan line Si. The first transistor T1 may be turned on when a scan signal is supplied to an $i^{th}$ scan line Si to supply a voltage of the second initialization power source Vint2 to the anode electrode of the organic light emitting device OLED.

When the voltage of the second initialization power source Vint2 is supplied to the anode electrode of the organic light emitting device OLED, a parasitic capacitor (hereinafter, referred to as an "organic capacitor Coled") of the organic light emitting device OLED may be discharged. When the organic capacitor Coled is discharged, a black expression capability may be improved.

To describe in detail, the organic capacitor Coled may charge a predetermined voltage in response to a current supplied from the pixel circuit PXC during a previous frame period. When the organic capacitor Coled is charged, the organic light emitting device OLED may easily emit light even with a low current.

A black data signal may be supplied to the pixel circuit PXC during a current frame period. When the black data signal is supplied, the pixel circuit PXC ideally would not supply a current to the organic light emitting device OLED. However, even though the black data signal is supplied, the pixel circuit PXC formed of the transistors may supply a predetermined leakage current to the organic light emitting device OLED. In this case, when the organic capacitor Coled is in a charging state, the organic light emitting device OLED may minutely emit light, and thus the black expression capability may be degraded.

In contrast, according to an example embodiment of the present disclosure, the organic capacitor Coled is discharged by the second initialization power source Vint2, and the organic light emitting device OLED is set in a non-emission state despite there being a leakage current. That is, in the present disclosure, the pixel circuit PXC may supply a voltage of the second initialization power source Vint2 to the anode electrode of the organic light emitting device OLED by using the second initialization power source Vint2 when the black data signal is supplied, thereby improving the black expression capability.

The second initialization power source Vint2 may be set with a voltage lower than the first initialization power source Vint1 and higher than the second power source ELVSS so that the organic capacitor Coled may be stably discharged. For example, the second initialization power source Vint2 may appropriately be set with a voltage obtained by adding a threshold voltage of the organic light emitting device OLED to the voltage of the second power source ELVSS.

In addition, in the present disclosure, when the first initialization power source Vint1 and the second initialization power source Vint2 are separated, a leakage current from the pixel circuit PXC may be minimized.

According to an exemplary embodiment, the voltage of the second power source ELVSS applied to the cathode electrode of the organic light emitting device OLED may be reduced to implement high brightness. When the voltage of the second power source ELVSS is decreased, the quantity of current supplied from the pixel circuit PXC to the organic light emitting device OLED is increased, and thus, brightness of the organic light emitting device OLED may be increased.

Here, when the voltage of the second power source ELVSS is decreased, the voltage of the second initialization power source Vint2 may also be decreased. Accordingly, in a case in which the first initialization power source Vint1 and the second initialization power source Vint2 are not separated, when the voltage of the second power source ELVSS is decreased, a leakage current flowing from the pixel circuit PXC to the initialization power source is increased.

On the other hand, when the first initialization power source Vint1 and the second initialization power source Vint2 are separated, like the embodiment of the present disclosure, the voltage of the first initialization power source Vint1 may be set regardless of the second power source ELVSS. Particularly, in the exemplary embodiment of the present disclosure, the first initialization power source Vint1 is set with a voltage higher than the second power source ELVSS and the second initialization power source Vint2, thereby minimizing a leakage current from the pixel circuit PXC to the first initialization power source Vint1.

Further, when the second initialization power source Vint2 is set with a voltage higher than the second power source ELVSS, it is possible to minimize a leakage current flowing from the pixel circuit PXC to the second initialization power source Vint2 during an emission period of the organic light emitting device OLED, and thus, it is possible to increase brightness of the organic light emitting device OLED.

Figure 5:
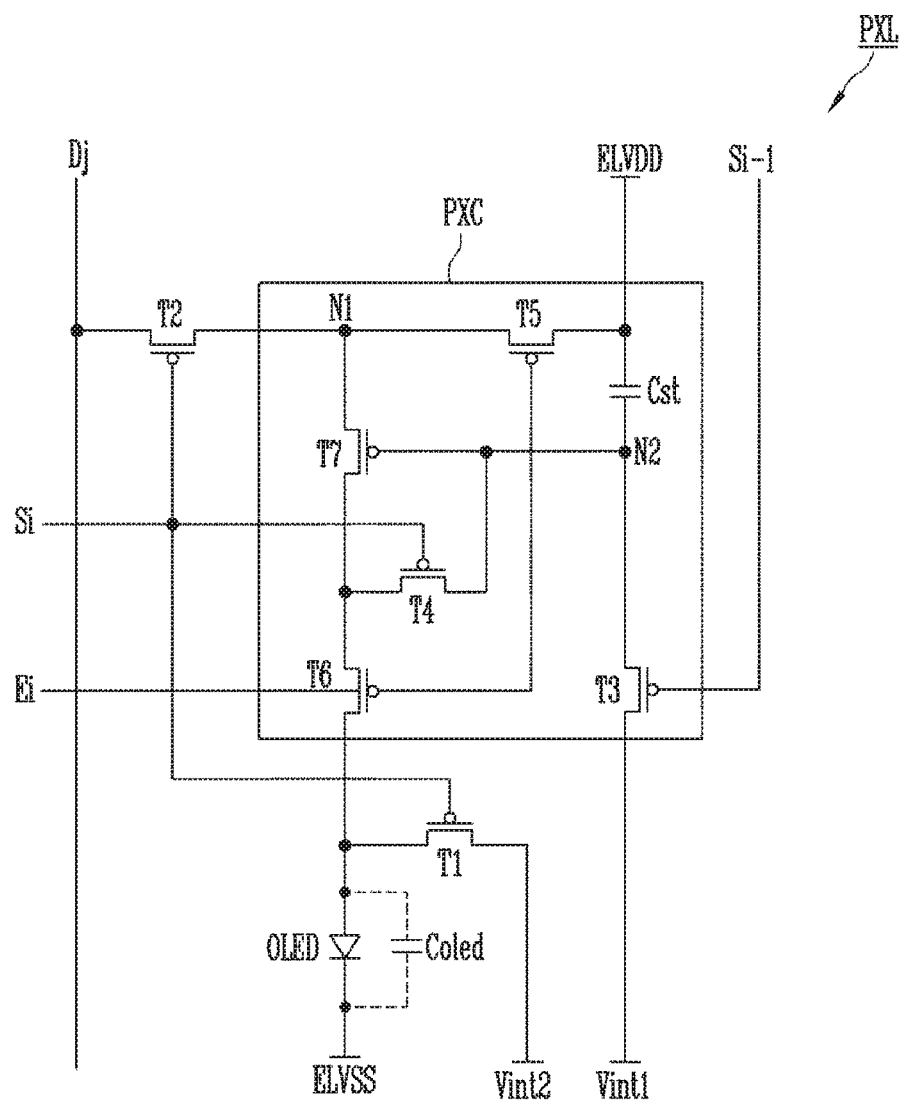
FIG. 5 is a diagram illustrating an exemplary embodiment of a pixel circuit illustrated in FIG. 4.

The second transistor T2 is connected between the data line Dj and the pixel circuit PXC (that is, a first node N1 illustrated in FIG. 5). Further, a gate electrode of the second transistor T2 is connected to an $i^{th}$ scan line Si. The second transistor T2 is turned on to supply a data signal from the data line Dj to the first node N1 when a scan signal is supplied to the $i^{th}$ scan line Si.

FIG. 5 is a diagram illustrating an exemplary embodiment of the pixel circuit illustrated in FIG. 4.

Referring to FIG. 5, the pixel circuit PXC according to the exemplary embodiment of the present disclosure may include a third transistor T3, a fourth transistor T4, a fifth transistor T5, a sixth transistor T6, a seventh transistor T7, and a storage capacitor Cst.

A first electrode of the seventh transistor T7 may be connected to a first node N1, and a second electrode of the seventh transistor T7 may be connected to a first electrode of the sixth transistor T6. A gate electrode of the seventh transistor T7 may be connected to a second node N2. The seventh transistor T7 may control the quantity of current flowing from a first power source ELVDD to a second power source ELVSS via an OLED in response to a voltage charged in the storage capacitor Cst.

A first electrode of the third transistor T3 may be connected to the second node N2, and a second electrode of the third transistor T3 may be connected to a first initialization power source Vint1. Further, a gate electrode of the third transistor T3 may be connected to an i-1th scan line Si-1. The third transistor T3 may be turned on to supply a voltage of the first initialization power source Vint1 to the second node N2 when a scan signal is supplied to the i-1th scan line Si-1.

A first electrode of the fourth transistor T4 may be connected to the second electrode of the seventh transistor T7, and a second electrode of the fourth transistor T4 may be connected to the second node N2. Further, a gate electrode of the fourth transistor T4 is connected to the $i^{th}$ scan line Si. The fourth transistor T4 may be turned on to connect the seventh transistor T7 in a diode form when a scan signal is supplied to the $i^{th}$ scan line Si.

A first electrode of the fifth transistor T5 may be connected to the first power source ELVDD, and a second electrode of the fifth transistor T5 may be connected to the first node N1. Further, a gate electrode of the fifth transistor T5 may be connected to an emission control line Ei. The fifth transistor T5 may be turned off when an emission control signal is supplied to the emission control line Ei, and turned on when the emission control signal is not supplied.

A first electrode of the sixth transistor T6 may be connected to the second electrode of the seventh transistor T7, and a second electrode of the sixth transistor T6 may be connected to the anode electrode of the organic light emitting device OLED. Further, a gate electrode of the sixth transistor T6 may be connected to the emission control line Ei. The sixth transistor T6 may be turned off when the emission control signal is supplied to the emission control line Ei, and turned on when the emission control signal is not supplied.

The storage capacitor Cst may be connected between the first power source ELVDD and the second node N2. The storage capacitor Cst may charge a voltage corresponding to a data signal and a threshold voltage of the seventh transistor T7.

Figure 6:
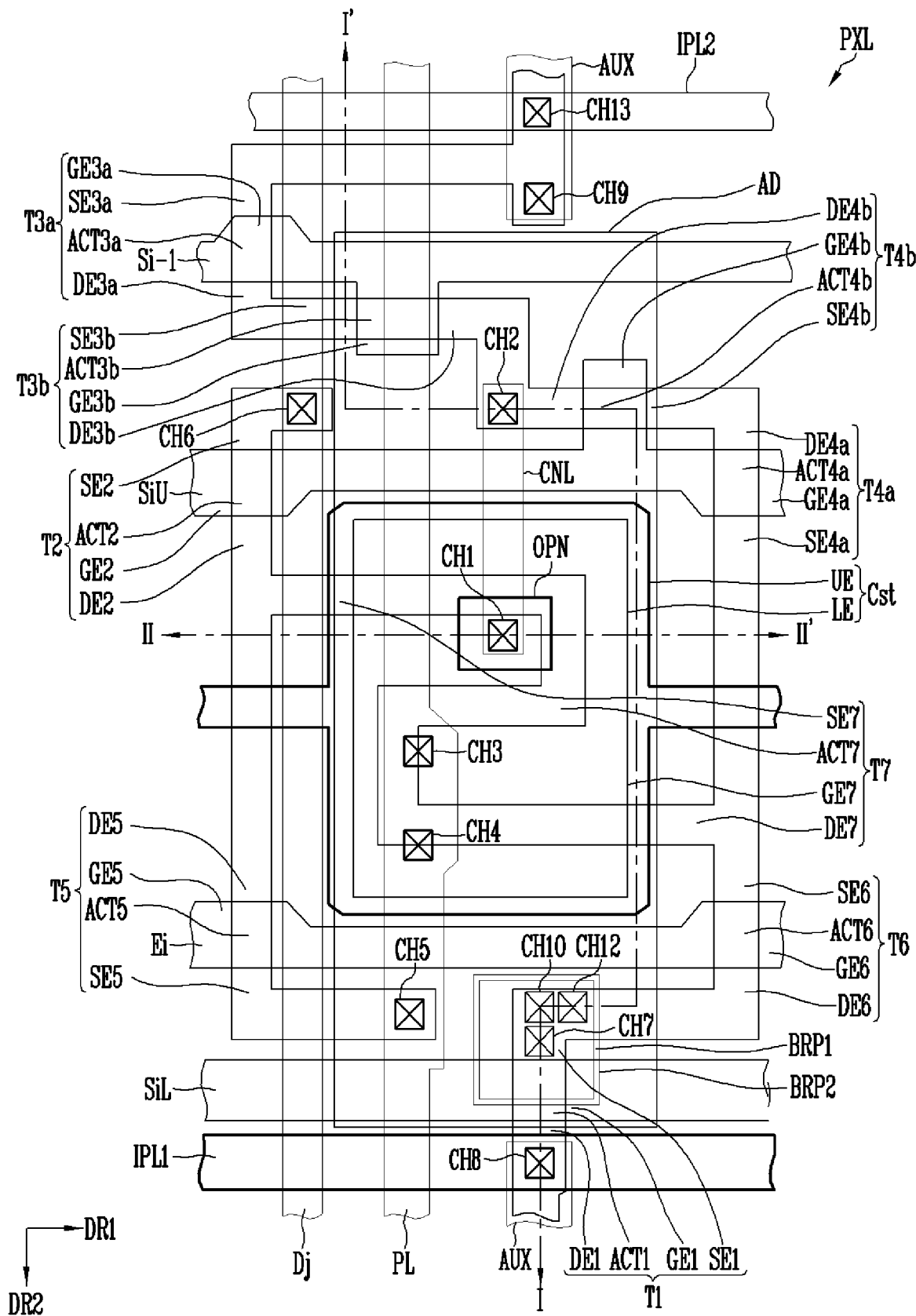
FIG. 6 is a top plan view illustrating the pixel illustrated in FIGS. 4 and 5 in detail.
Figure 7:
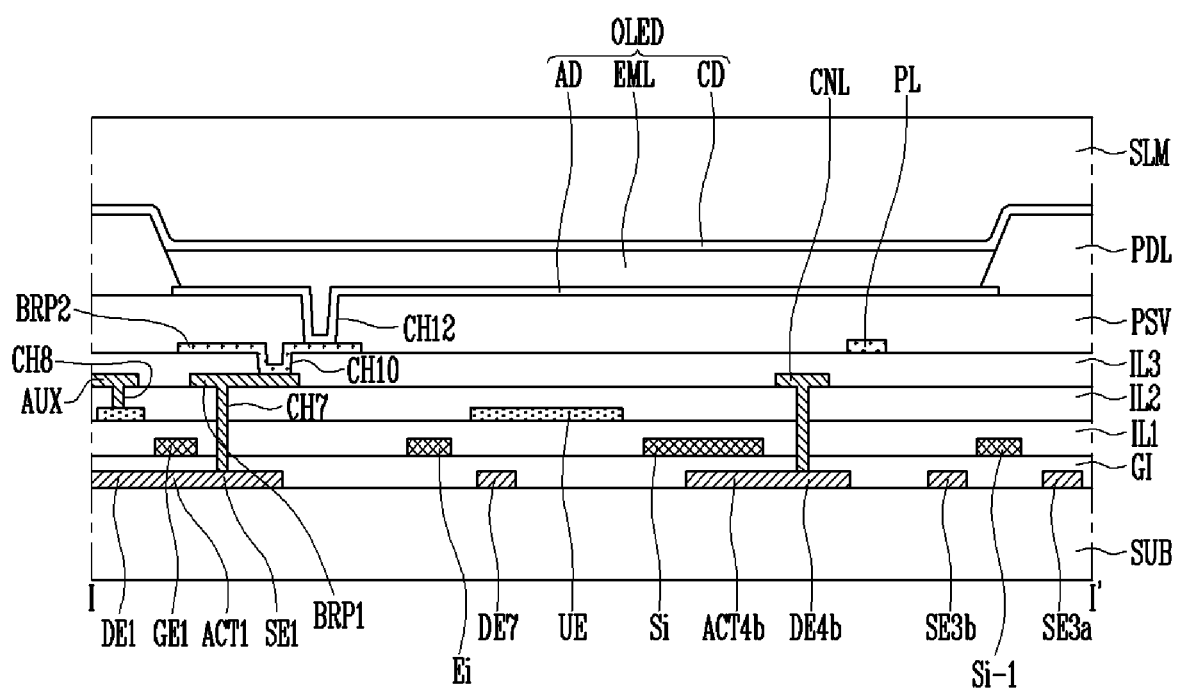
FIG. 7 is a cross-sectional view taken along line I-I' of FIG. 6.
Figure 8:
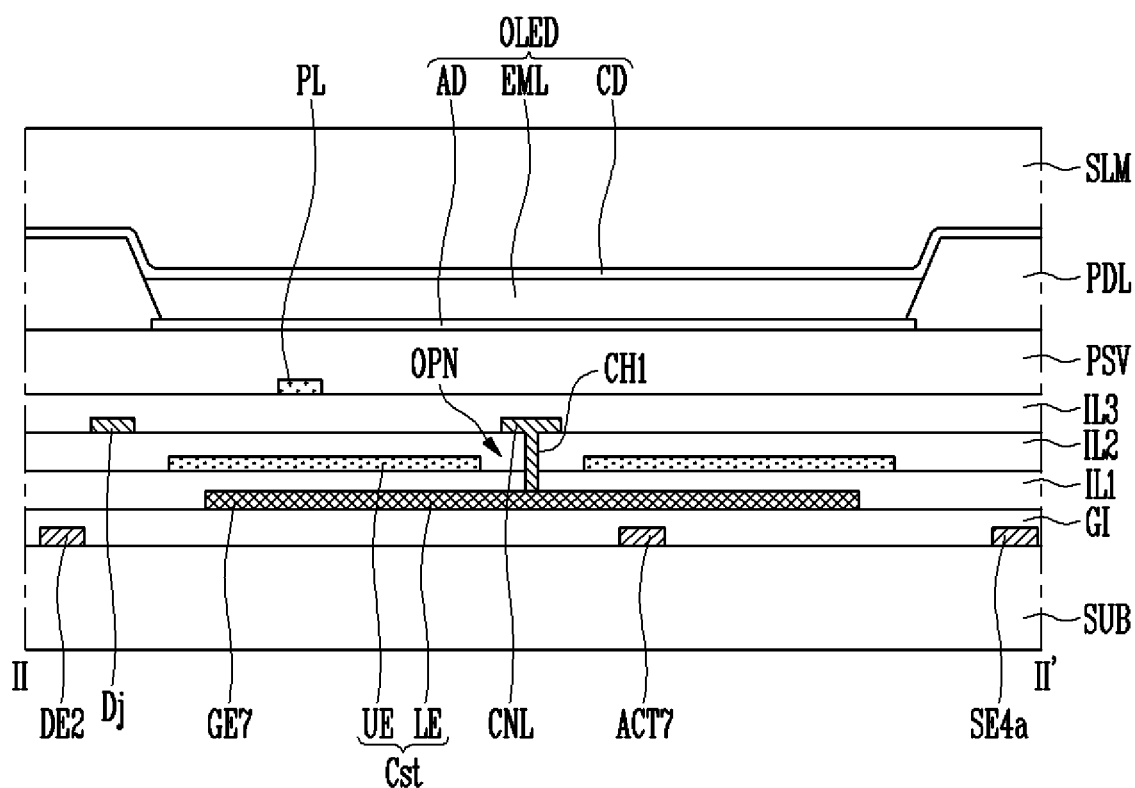
FIG. 8 is a cross-sectional view taken along line II-II' of FIG. 6.

FIG. 6 is a top plan view illustrating the pixel illustrated in FIGS. 4 and 5 in detail, FIG. 7 is a cross-sectional view taken along line I-I' of FIG. 6, and FIG. 8 is a cross-sectional view taken along line II-II' of FIG. 6.

FIGS. 6 to 8 illustrate scan lines Si-1 and Si, an emission control line Ei, a power line PL, and a data line Dj connected to one pixel PXL disposed in an $i^{th}$ row and a $j^{th}$ column in the pixel area PXA. In FIGS. 7 and 8, for convenience of the description, a scan line in an i-1$^{th}$ row is labeled "Si-1", a scan line in an $i^{th}$ row is labeled "Si", an emission control line in an $i^{th}$ row is labeled "Ei", a data line in a $j^{th}$ column is labeled "Dj", and a $j^{th}$ power line is labeled "PL".

Referring to FIGS. 4 to 8, the display device may include a substrate SUB, a wiring unit, and pixels PXL.

The substrate SUB includes a transparent insulating material to allow light to pass through. The substrate SUB may be a rigid substrate. For example, the substrate SUB may be one of a glass substrate, a quartz substrate, a glass ceramic substrate, and a crystalline glass substrate.

Further, the substrate SUB may also be a flexible substrate. Here, the substrate SUB may be one of a film substrate including a polymer organic material, and a plastic substrate. For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material of the substrate SUB may be variously changed, and may include Fiber Reinforced Plastic (FRP).

The wiring unit may provide a signal to each of the pixels PXL, and may include scan lines Si-1 and Si, a data line Dj, an emission control line Ei, a power line PL, a first initialization power line IPL1, and a second initialization power line IPL2.

The scan lines Si-1 and Si may be extended in the first direction DR1. The scan lines Si-1 and Si may include an i-1$^{th}$ scan line Si-1 and an $i^{th}$ scan line Si, which are sequentially arranged in the second direction DR2. The scan lines Si-1 and Si may receive a scan signal. For example, the i-1$^{th}$ scan line Si-1 may receive an i-1$^{th}$ scan signal, and the $i^{th}$ scan line Si may receive an $i^{th}$ scan signal. The pixel may be initialized by the i-1$^{th}$ scan signal of the i-1$^{th}$ scan line Si-1.

The $i^{th}$ scan line Si may be branched into two lines, and the branched $i^{th}$ scan lines Si may be connected to different transistors. For example, the $i^{th}$ scan line Si may include an $i^{th}$ upper scan line SiU adjacent to the i-1$^{th}$ scan line Si-1, and an $i^{th}$ lower scan line SiL farther from the i-1$^{th}$ scan line Si-1 than the $i^{th}$ upper scan line SiU is from the i-1$^{th}$ scan line Si-1.

The emission control line Ei may be extended in the first direction DR1. The emission control line Ei may be disposed to be spaced apart from the $i^{th}$ scan lines Si between the $i^{th}$ scan lines Si. The emission control line Ei may receive an emission control signal.

The data line Dj may be extended in the second direction DR2, and may be sequentially arranged in the first direction DR1. The data line Dj may receive a data signal.

The power line PL may be extended in the second direction DR2. The power line PL may be disposed so as to be spaced apart from the data line Dj. The power line PL may receive the first power source ELVDD.

The first initialization power line IPL1 and the second initialization power line IPL2 may be extended in the first direction DR1.

The first initialization power line IPL1 may be provided between the $i^{th}$ lower scan line SiL and the second initialization power line of the pixel in the i+1$^{th}$ pixel row (not shown). The first initialization power line IPL1 may receive the first initialization power source Vint1.

The second initialization power line IPL2 may be provided between the first initialization power line of the pixel in the i-1$^{th}$ pixel row (not shown) and the i-1$^{th}$ scan line Si-1 of the pixel in the i-1$^{th}$ pixel row. The second initialization power line IPL2 may receive the second initialization power source Vint2.

Each of the pixels PXL may include a first transistor T1 to a seventh transistor T7, a storage capacitor Cst, and an OLED.

The seventh transistor T7 may include a seventh gate electrode GE7, a seventh active pattern ACT7, a seventh source electrode SE7, a seventh drain electrode DE7, and a connection line CNL.

The seventh gate electrode GE7 may be connected with a third drain electrode DE3 of the third transistor T3 and a fourth drain electrode DE4 of the fourth transistor T4. The connection line CNL may connect the seventh gate electrode GE7 and a space between the third drain electrode DE3 and the fourth drain electrode DE4. One end of the connection line CNL may be connected with the seventh gate electrode GE7 through a first contact hole CH1, the other end of the connection line CNL may be connected with the third drain electrode DE3 and the fourth drain electrode DE4 through a second contact hole CH2.

In the exemplary embodiment of the present disclosure, the seventh active pattern ACT7, the seventh source electrode SE7, and the seventh drain electrode DE7 may be formed of a semiconductor layer, which may or may not be doped with impurities. For example, the seventh source electrode SE7 and the seventh drain electrode DE7 may be formed of a semiconductor layer that is doped with impurities, and the seventh active pattern ACT7 may be formed of a semiconductor layer that is not doped with impurities.

The seventh active pattern ACT7 has a bar shape extended in a predetermined direction, and may have a shape that is bent several times in an extended longitudinal direction. The seventh active pattern ACT7 may overlap the seventh gate electrode GE7 when is viewed on the plane. The seventh active pattern ACT7 is formed such that a channel area of the seventh transistor T7 may be formed long. Accordingly, a driving range of a gate voltage applied to the seventh transistor T7 is widened. Accordingly, it is possible to finely control a gray scale of light emitted from the organic light emitting device OLED.

The seventh source electrode SE7 may be connected to one end of the seventh active pattern ACT7. The seventh source electrode SE7 may be connected with a second drain electrode DE2 of the second transistor T2 and a fifth drain electrode DE5 of the fifth transistor T5. The seventh drain electrode DE7 may be connected to the other end of the seventh active pattern ACT7. The seventh drain electrode DE7 may be connected with a fourth source electrode SE4 of the fourth transistor T4 and a sixth source electrode SE6 of the sixth transistor T6.

The second transistor T2 may include a second gate electrode GE2, a second active pattern ACT2, a second source electrode SE2, and a second drain electrode DE2.

The second gate electrode GE2 may be connected to the $i^{th}$ upper scan line SiU. The second gate electrode GE2 may be provided as a part of the $i^{th}$ upper scan line SiU, or in a shape protruding from the $i^{th}$ upper scan line SiU. In the exemplary embodiment of the present disclosure, the second active pattern ACT2, the second source electrode SE2, and the second drain electrode DE2 may be formed of a semiconductor layer, which may or may not be doped with impurities. For example, the second source electrode SE2 and the second drain electrode DE2 may be formed of a semiconductor layer that is doped with impurities, and the second active pattern ACT2 may be formed of a semiconductor layer that is not doped with impurities. The second active pattern ACT2 corresponds to a portion overlapping the second gate electrode GE2. One end of the second source electrode SE2 may be connected to the second active pattern ACT2. The other end of the second source electrode SE2 may be connected to the data line Dj through a sixth contact hole CH6. One end of the second drain electrode DE2 may be connected to the second active pattern ACT2. The other end of the second drain electrode DE2 may be connected with the seventh source electrode SE7 of the seventh transistor T7 and the fifth drain electrode DE5 of the fifth transistor T5.

The third transistor T3 may be provided in a dual gate structure for preventing a leakage current. That is, the third transistor T3 may include a $3a^{th}$ transistor T3a and a $3b^{th}$ transistor T3b. The $3a^{th}$ transistor T3a may include a $3a^{th}$ gate electrode GE3a, a $3a^{th}$ active pattern ACT3a, a $3a^{th}$ source electrode SE3a, and a $3a^{th}$ drain electrode DE3a, and the $3b^{th}$ transistor T3b may include a $3b^{th}$ gate electrode GE3b, a $3b^{th}$ active pattern ACT3b, a $3b^{th}$ source electrode SE3b, and a $3b^{th}$ drain electrode DE3b. Hereinafter, the $3a^{th}$ gate electrode GE3a and the $3b^{th}$ gate electrode GE3b will be referred to as a third gate electrode GE3, the $3a^{th}$ active pattern ACT3a and the $3b^{th}$ active pattern ACT3b will be referred to as a third active pattern ACT3, the $3a^{th}$ source electrode SE3a and the $3b^{th}$ source electrode SE3b will be referred to as a third source electrode SE3, and the $3a^{th}$ drain electrode DE3a and the $3b^{th}$ drain electrode DE3b will be referred to as a third drain electrode DE3.

The third gate electrode GE3 may be connected to the $i-1^{th}$ scan line Si-1. The third gate electrode GE3 may be provided as a part of the $i-1^{th}$ scan line Si-1, or in a shape protruding from the $i-1^{th}$ scan line Si-1. For example, the $3a^{th}$ gate electrode GE3a may be provided as a part of the $i-1^{th}$ scan line Si-1, and the $3b^{th}$ gate electrode GE3b may be provided in a shape protruding from the $i-1^{th}$ scan line Si-1.

The third active pattern ACT3, the third source electrode SE3, and the third drain electrode DE3 may be formed of a semiconductor layer that is or is not doped with impurities. For example, the third source electrode SE3 and the third drain electrode DE3 may be formed of a semiconductor layer that is doped with impurities, and the third active pattern ACT3 may be formed of a semiconductor layer that is not doped with impurities. The third active pattern ACT3 corresponds to a portion overlapping the third gate electrode GE3.

One end of the third source electrode SE3 may be connected to the third active pattern ACT3. The other end of the third source electrode SE3 may be connected to the first initialization power line IPL1 and the first drain electrode DE1 of the first transistor T1 of the pixel in the $i-1^{th}$ pixel row. The other end of the third source electrode SE3 may be connected with the second initialization power line IPL2 through an thirteenth contact hole CH13. An auxiliary connection line AUX may be provided between the third source electrode SE3 and a first drain electrode DE1 of a first transistor T1 of a pixel in a previous row (i.e., $i-1^{th}$ pixel row). One end of the auxiliary connection line AUX may be connected with the third source electrode SE3 through the ninth contact hole CH9. The other end of the auxiliary connection line AUX may be connected with the first initialization power line IPL1 in the $i-1^{th}$ pixel row through an eighth contact hole CH8 in the $i-1^{th}$ pixel row. Further, a part of the auxiliary connection line AUX may be connected with the second initialization power line IPL2 through a thirteenth contact hole CH13. One end of the third drain electrode DE3 may be connected to the third active pattern ACT3. The other end of the third drain electrode DE3 is connected to the fourth drain electrode DE4 of the fourth transistor T4. The third drain electrode DE3 is also connected to the seventh gate electrode GE7 of the seventh transistor T7 through the connection line CNL, the second contact hole CH2, and the first contact hole CH1.

The fourth transistor T4 may be provided in a dual gate structure for preventing a leakage current. That is, the fourth transistor T4 may include a $4a^{th}$ transistor T4a and a $4b^{th}$ transistor T4b. The 4a$^{th}$ transistor T4a may include a 4a$^{th}$ gate electrode GE4a, a 4a$^{th}$ active pattern ACT4a, a 4a$^{th}$ source electrode SE4a, and a 4a$^{th}$ drain electrode DE4a. The 4b$^{th}$ transistor T4b may include a 4b$^{th}$ gate electrode GE4b, a 4b$^{th}$ active pattern ACT4b, a 4b$^{th}$ source electrode SE4b, and a 4b$^{th}$ drain electrode DE4b. Hereinafter, the 4a$^{th}$-gate electrode GE4a and the 4b$^{th}$ gate electrode GE4b will be referred to as a fourth gate electrode GE4, the 4a$^{th}$ active pattern ACT4a and the 4b$^{th}$ active pattern ACT4b will be referred to as a fourth active pattern ACT4, the 4a$^{th}$ source electrode SE4a and the 4b$^{th}$ source electrode SE4b will be referred to as a fourth source electrode SE4, and the 4a$^{th}$ drain electrode DE4a and the 4b$^{th}$ drain electrode DE4b will be referred to as a fourth drain electrode DE4.

The fourth gate electrode GE4 may be connected to the i$^{th}$ upper scan line SiU. The fourth gate electrode GE4 may be provided as a part of the i$^{th}$ upper scan line SiU, or in a shape protruding from the i$^{th}$ upper scan line SiU. For example, the 4a$^{th}$ gate electrode GE4a may be provided in a shape protruding from the i$^{th}$ upper scan line SiU, and the 4b$^{th}$ gate electrode GE4b may be provided as a part of the i$^{th}$ upper scan line SiU.

The fourth active pattern ACT4, the fourth source electrode SE4, and the fourth drain electrode DE4 may be formed of a semiconductor layer that is or is not doped with impurities. For example, the fourth source electrode SE4 and the fourth drain electrode DE4 may be formed of a semiconductor layer that is doped with impurities, and the forth active pattern ACT4 may be formed of a semiconductor layer that is not doped with impurities. The fourth active pattern ACT4 corresponds to a portion overlapping the fourth gate electrode GE4. One end of the fourth source electrode SE4 may be connected to the fourth active pattern ACT4. The other end of the fourth source electrode SE4 may be connected with the seventh drain electrode DE7 of the seventh transistor T7 and the sixth source electrode SE6 of the sixth transistor T6. One end of the fourth drain electrode DE4 may be connected to the fourth active pattern ACT4. The other end of the fourth drain electrode DE4 may be connected to the third drain electrode DE3 of the third transistor T3. Further, the fourth drain electrode DE4 may be connected to the seventh gate electrode GE7 of the seventh transistor T7 through the connection line CNL, the second contact hole CH2, and the first contact hole CH1.

The fifth transistor T5 may include a fifth gate electrode GE5, a fifth active pattern ACT5, a fifth source electrode SE5, and a fifth drain electrode DE5.

The fifth gate electrode GE5 may be connected to the emission control line Ei. The fifth gate electrode GE5 may be provided as a part of the emission control line Ei or in a shape protruding from the emission control line Ei. The fifth active pattern ACT5, the fifth source electrode SE5, and the fifth drain electrode DE5 may be formed of a semiconductor layer that is or is not doped with impurities. For example, the fifth source electrode SE5 and the fifth drain electrode DE5 may be formed of a semiconductor layer that is doped with impurities, and the fifth active pattern ACT5 may be formed of a semiconductor layer that is not doped with impurities. The fifth active pattern ACT5 corresponds to a portion overlapping the fifth gate electrode GE5. One end of the fifth source electrode SE5 may be connected to the fifth active pattern ACT5. The other end of the fifth source electrode SE5 may be connected to the power line PL through a fifth contact hole CH5. One end of the fifth drain electrode DE5 may be connected to the fifth active pattern ACT5. The other end of the fifth drain electrode DE5 may be connected with the seventh source electrode SE7 of the seventh transistor T7 and the second drain electrode DE2 of the second transistor T2.

The sixth transistor T6 may include a sixth gate electrode GE6, a sixth active pattern ACT6, a sixth source electrode SE6, and a sixth drain electrode DE6.

The sixth gate electrode GE6 may be connected to the emission control line Ei. The sixth gate electrode GE6 may be provided as a part of the emission control line Ei or in a shape protruding from the emission control line Ei. The sixth active pattern ACT6, the sixth source electrode SE6, and the sixth drain electrode DE6 may be formed of a semiconductor layer that is or is not doped with impurities. For example, the sixth source electrode SE6 and the sixth drain electrode DE6 may be formed of a semiconductor layer that is doped with impurities, and the sixth active pattern ACT6 may be formed of a semiconductor layer that is not doped with impurities. The sixth active pattern ACT6 corresponds to a portion overlapping the sixth gate electrode GE6. One end of the sixth source electrode SE6 may be connected to the sixth active pattern ACT6. The other end of the sixth source electrode SE6 may be connected with the seventh drain electrode DE7 of the seventh transistor T7 and the fourth source electrode SE4 of the fourth transistor T4. One end of the sixth drain electrode DE6 may be connected to the sixth active pattern ACT6. The other end of the sixth drain electrode DE6 may be connected to a first source electrode SE1 of the first transistor T1.

The first transistor T1 may include a first gate electrode GE1, a first active pattern ACT1, a first source electrode SE1, and a first drain electrode DE1.

The first gate electrode GE1 may be connected to the i$^{th}$ lower scan line SiL. The first gate electrode GE1 may be provided as a part of the i$^{th}$ lower scan line SiL, or in a shape protruding from the i$^{th}$ lower scan line SiL. The first active pattern ACT1, the first source electrode SE1, and the first drain electrode DE1 may be formed of a semiconductor layer that is or is not doped with impurities. For example, the first source electrode SE1 and the first drain electrode DE1 may be formed of a semiconductor layer that is doped with impurities, and the first active pattern ACT1 may be formed of a semiconductor layer that is not doped with impurities. The first active pattern ACT1 corresponds to a portion overlapping the first gate electrode GE1. One end of the first source electrode SE1 may be connected to the first active pattern ACT1. The other end of the first source electrode SE1 may be connected to the sixth drain electrode DE6 of the sixth transistor T6. One end of the first drain electrode DE1 may be connected to the first active pattern ACT1. The other end of the first drain electrode DE1 may be connected to the second initialization power line IPL2. Further, the first drain electrode DE1 may be connected to a third source electrode SE3 of a third transistor T3 of a pixel of a subsequent row (i.e., i+1$^{th}$ pixel row). The first drain electrode DE1 and the third source electrode SE3 of the third transistor T3 of the pixel in the i+1$^{th}$ pixel row may be connected.

The storage capacitor Cst may include a lower electrode LE and an upper electrode UE. The lower electrode LE may be formed of the seventh gate electrode GE7 of the seventh transistor T7.

The upper electrode UE may overlap the seventh gate electrode GE7, and may cover the lower electrode LE when is viewed on a plane. Capacitance of the storage capacitor Cst may be increased by increasing an overlapping area of the upper electrode UE and the lower electrode LE. The upper electrode UE may be extended in the first direction DR1. In the exemplary embodiment of the present disclosure, a voltage having the same level as that of the first power source ELVDD may be applied to the upper electrode UE. The upper electrode UE may have an opening OPN in an area, in which the first contact hole CH1, through which the seventh gate electrode GE7 contacts the connection line CNL, is formed.

The organic light emitting device OLED may include a first electrode AD, a second electrode CD, and an emission layer EML provided between the first electrode AD and the second electrode CD.

The first electrode AD may be provided within an emission area corresponding to each pixel PXL. The first electrode AD may be connected to the first source electrode SE1 of the first transistor T1 and the sixth drain electrode DE6 of the sixth transistor T6 through a seventh contact hole CH7, a tenth contact hole CH10, and a twelfth contact hole CH12. A first bridge pattern BRP1 may be provided between the seventh contact hole CH7 and the tenth contact hole CH10. The first bridge pattern BRP1 may connect the sixth drain electrode DE6, the first source electrode SE1, and the first electrode AD.

Hereinafter, a structure of a display device according to an exemplary embodiment of the present disclosure will be described in a lamination sequence with reference to FIGS. 6 to 8.

Active patterns ACT1 to ACT7 (hereinafter, referred to as an "ACT") may be provided on a substrate SUB. The active patterns may include a first active pattern ACT1 to a seventh active pattern ACT7. The first active pattern ACT1 to the seventh active pattern ACT7 may be formed of a semiconductor material.

A buffer layer (not illustrated) may be provided between the substrate SUB and the first active pattern ACT1 to the seventh active pattern ACT7.

A gate insulating layer GI may be provided on the substrate SUB on which the first active pattern ACT1 and the seventh active pattern ACT7 are formed.

An i−1th scan line Si-1, the ith scan line Si, an emission control line Ei, a first gate electrode GE1 and a seventh gate electrode GE7 may be provided on the gate insulating layer GI. The seventh gate electrode GE17 may be the lower electrode LE of the storage capacitor Cst. The second gate electrode GE2 and the fourth gate electrode GE4 may be integrally formed with the ith upper scan line SiU. The third gate electrode GE3 may be integrally formed with the i−1th scan line Si-1. The fifth gate electrode GE5 and the sixth gate electrode GE6 may be integrally formed with the emission control line Ei. The first gate electrode GE1 may be integrally formed with the ith lower scan line SiL.

A first interlayer insulating layer IL1 may be provided on the substrate SUB, on which the i−1$^{th}$ scan line Si-1 and the like are formed.

The upper electrode UE of the storage capacitor Cst, the first initialization power line IPL1, and the second initialization power line IPL2 may be provided on the first interlayer insulating layer IL1. The upper electrode UE may cover or overlap the lower electrode LE. The upper electrode UE may form the storage capacitor Cst together with the lower electrode LE with the first interlayer insulating layer IL1 interposed therebetween.

A second interlayer insulating layer IL2 may be provided on the substrate SUB to cover the upper electrode UE, the first initialization power line IPL1, and the second initialization power line IPL2.

A data line Dj, a connection line CNL, an auxiliary connection line AUX, and a first bridge pattern BRP1 may be provided on the second interlayer insulating layer IL2.

The data line Dj may be connected to the second source electrode SE2 through the sixth contact hole CH6, which passes through the first interlayer insulating layer IL1, the second interlayer insulating layer IL2, and the gate insulating layer GI.

The connection line CNL may be connected to the seventh gate electrode GE7 through the first contact hole CH1, which passes through the first interlayer insulating layer IL1 and the second interlayer insulating layer IL2. Further, the connection line CNL may be connected to the third drain electrode DE3 and the fourth drain electrode DE4 through the second contact hole CH2, which passes through the gate insulating layer GI, the first interlayer insulating layer IL1, and the second interlayer insulating layer IL2.

The auxiliary connection line AUX may be connected to the second initialization power line IPL2 through the eighth contact hole CH8, which passes through the second interlayer insulating layer IL2. Further, the auxiliary connection line AUX may be connected to the third source electrode SE3 and the first drain electrode DE1 of a previous pixel row through the ninth contact hole CH9, which passes through the gate insulating layer GI, the first interlayer insulating layer Ill, and the second interlayer insulating layer IL2.

The first bridge pattern BRP1 may be a pattern provided between the sixth drain electrode DE6 and the first electrode AD as a medium connecting the sixth drain electrode DE6 and the first electrode AD. The first bridge pattern BRP1 is connected to the sixth drain electrode DE6 and the first source electrode SE1 through the seventh contact hole CH7, which passes through the gate insulating layer GI, the first interlayer insulating layer IL1, and the second interlayer insulating layer IL2.

A third interlayer insulating layer IL3 may be provided on the substrate SUB to cover the j$^{th}$ data line Dj and the like.

A power line PL and a second bridge pattern BRP2 may be provided on the third interlayer insulating layer IL3. The second bridge pattern BRP2 may be connected to the first bridge pattern BRP1 through the tenth contact hole CH10.

A passivation layer PSV may be provided on the third interlayer insulating layer IL3 on which the power line PL and the second bridge pattern BRP2 are provided.

The organic light emitting device OLED may be provided on the passivation layer PSV. The organic light emitting device OLED may include a first electrode AD, a second electrode CD, and an emission layer EML provided between the first electrode AD and the second electrode CD.

The first electrode AD may be provided on the passivation layer PSV. The first electrode AD may be connected to the second bridge pattern BRP2 through the twelfth contact hole CH12, which passes through the third interlayer insulating layer IL3 and the passivation layer PSV. Accordingly, the first electrode AD may be electrically connected to the first bridge pattern BRP1. The first bridge pattern BRP1 is connected to the sixth drain electrode DE6 and the first source electrode SE1 through the seventh contact hole CH7, so that the first electrode AD may be electrically connected to the sixth drain electrode DE6 and the first source electrode SE1.

A pixel defining layer PDL, which divides an emission area to correspond to each pixel PXL, is provided on the substrate SUB on which the first electrode AD and the like are formed. The pixel defining layer PDL protrudes from the substrate SUB along a perimeter of the pixel PXL while exposing an upper surface of the first electrode AD.

The emission layer EML may be provided in the emission area surrounded by the pixel defining layer PDL, and the second electrode CD may be provided on the emission layer EML. A sealing layer SLM covering the second electrode CD is provided on the second electrode CD.

One of the first electrode AD and the second electrode CD may be an anode electrode, and the other may be a cathode electrode. For example, the first electrode AD may be an anode electrode, and the second electrode CD may be a cathode electrode.

Further, at least one of the first electrode AD and the second electrode CD may be a transmissive electrode. For example, when the organic light emitting device OLED is a bottom emission organic light emitting device, the first electrode AD may be a transmissive electrode, and the second electrode CD may be a reflective electrode. For example, when the organic light emitting device OLED is a top emission organic light emitting device, the first electrode AD may be a reflective electrode, and the second electrode CD may be a transmissive electrode. For example, when the organic light emitting device OLED is a dual-type organic light emitting device, both the first electrode AD and the second electrode CD may be transmissive electrodes. In the present exemplary embodiment, a case in which the organic light emitting device OLED is the top emission organic light emitting device, and the first electrode AD is an anode electrode will be described as an example.

The first electrode AD may include a reflective layer (not illustrated), which is capable of reflecting light, and a transparent conductive layer (not illustrated) disposed above or under the reflective layer. At least one of the transparent conductive layer and the reflective layer may be connected with the first source electrode SE1.

The reflective layer may include a material that is capable of reflecting light. For example, the reflective layer may include at least one of aluminum (Al), silver (Ag), chrome (Cr), molybdenum (Mo), platinum (Pt), nickel (Ni), and an alloy thereof.

The transparent conductive layer may include a transparent conductive oxide. For example, the transparent conductive layer may include at least one transparent conductive oxide among an indium tin oxide (ITO), an indium zinc oxide (IZO), an aluminum zinc oxide (AZO), a gallium doped zinc oxide (GZO), a zinc tin oxide (ZTO), a Gallium tin oxide (GTO), and a fluorine doped tin oxide (FTO).

The pixel defining layer PDL may include an organic insulating material. For example, the pixel defining layer PDL may include at least one of polystylene, polymethylmetaacrylate (PMMA), polyacrylonitrile (PAN), polyamide (PA), polyimide (PI), polyarylether (PAE), heterocyclic polymer, parylene, epoxy, benzocycloubutene (BCB), siloxane based resin, and silane based resin.

The emission layer EML may be disposed on an exposed surface of the first electrode AD. The emission layer EML may have a multi-layer thin film structure including a light generation layer LGL. For example, the emission layer EML may include a hole injection layer HIL for injecting holes, a hole transport layer HTL, the light generation layer, a hole blocking layer HBL, an electron transport layer ETL, and an electron injection layer EIL. The hole transport layer HTL has an excellent hole transporting property and suppresses the movement of electrons that have failed to be combined in the emitting layer EML, so as to increase the opportunity for the holes and the electrons to be re-combined. The light generating layer emits light by the re-combination of the injected electrons and holes. The hole blocking layer HBL suppresses the movement of holes that have failed to be combined in the light generating layer. The electron transport layer ETL smoothly transports electrons to the light generating layer. The electron injection layer EIL injects electrons.

A color of light generated in the light generation layer may be one of red, green, blue, and white, but this is not limited in the present exemplary embodiment. For example, a color of light generated in the light generation layer of the emission layer EML may be one of magenta, cyan, and yellow.

The hole injection layer, the hole transport layer, the hole blocking layer, the electron transport layer, and the electron injection layer may be common layers connected in the adjacent emission areas.

The second electrode CD may be a semi-transmissive reflective layer. For example, the second electrode CD may be a thin metal layer having a thickness in which light emitted from the emission layer EML may pass through. The second electrode CD may enable a part of light emitted from the emission layer EML to pass through, and reflect the residue of the light emitted from the emission layer EML.

The second electrode CD may include a material having a lower work function than that of the transparent conductive layer. For example, the second electrode CD may include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chrome (Cr), lithigum (Li), calcium (Ca), and an alloy thereof.

A part of the light emitted from the emission layer EML may fail to pass through the second electrode CD, and the light reflected from the second electrode CD may be reflected from the reflective layer again. That is, the light emitted from the emission layer EML may resonate between the reflective layer and the second electrode CD. Light extraction efficiency of the display devices OLED may be improved by the resonance of the light.

A distance between the reflective layer and the second electrode CD may be different according to a color of the light emitted from the emission layer EML.

That is, a distance between the reflective layer and the second electrode CD may be adjusted according to a color of the light emitted from the emission layer EML to achieve resonance of the emitted light.

The sealing layer SLM may prevent oxygen and moisture from permeating into the organic light emitting device OLED. The sealing layer SLM may include a plurality of inorganic layers (not illustrated) and a plurality of organic layers (not illustrated). For example, the sealing layer SLM may include a plurality of unit sealing layers including the inorganic layer and the organic layer disposed on the inorganic layer. Further, the inorganic layer may be disposed in the uppermost portion of the sealing layer SLM. The inorganic layer may include at least one of a silicon oxide, a silicon nitride, a silicon oxynitride, an aluminum oxide, a titanium oxide, a zirconium oxide, and a tin oxide.

Figure 9:
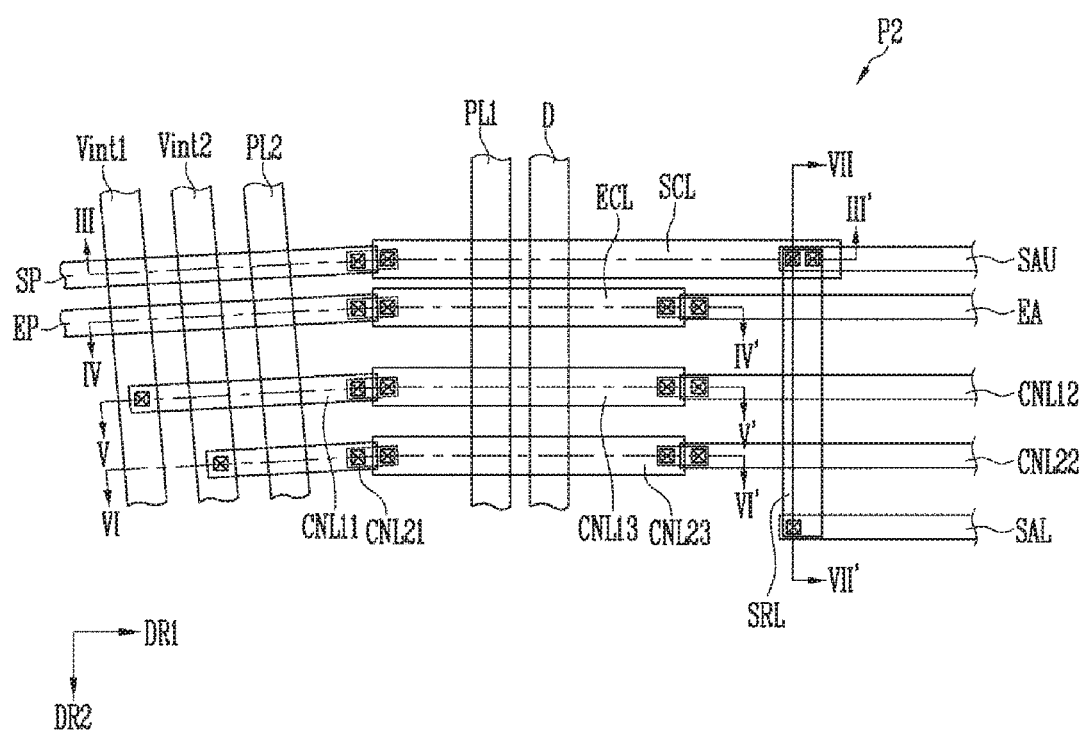
FIG. 9 is a top plan view conceptually illustrating a part corresponding to P2 of FIG. 3.
Figure 10:
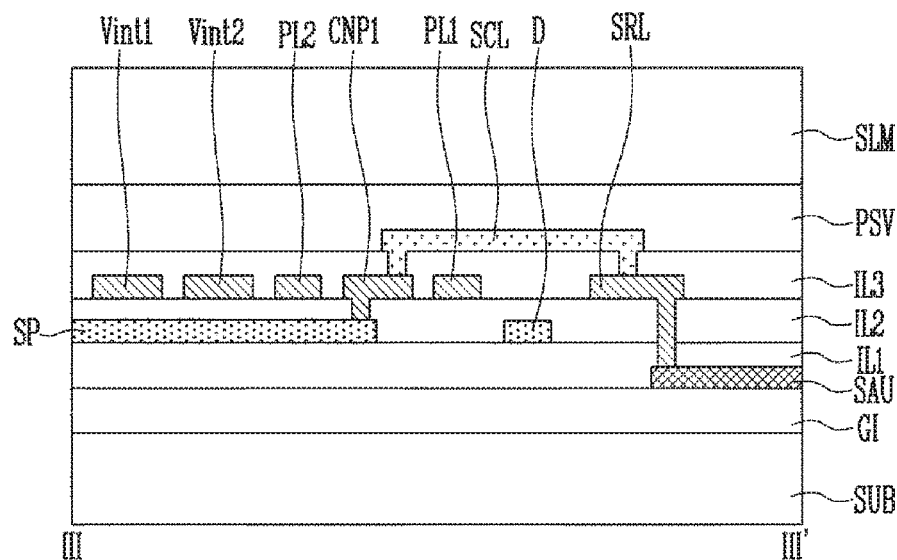
FIG. 10 is a cross-sectional view taken along line of FIG. 9.
Figure 11:
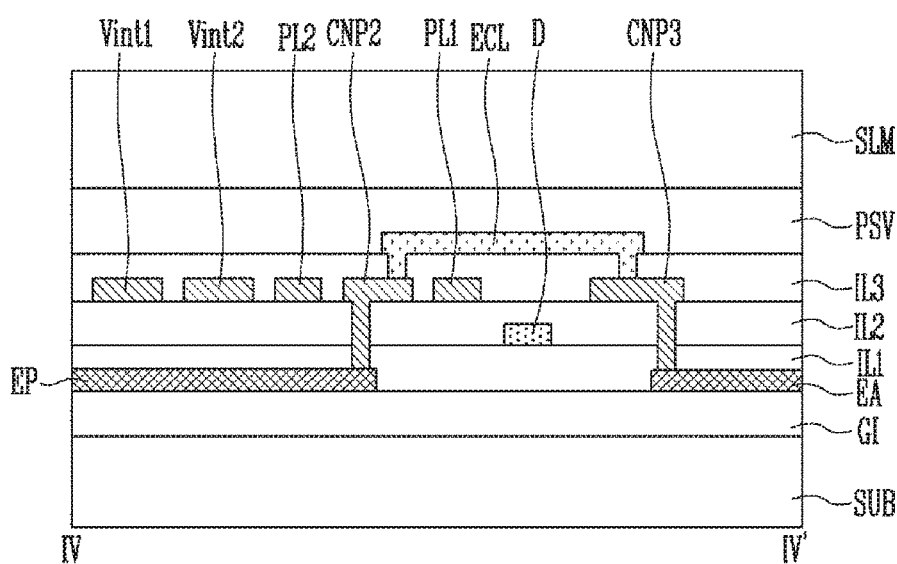
FIG. 11 is a cross-sectional view taken along line IV-IV' of FIG. 9.
Figure 12:
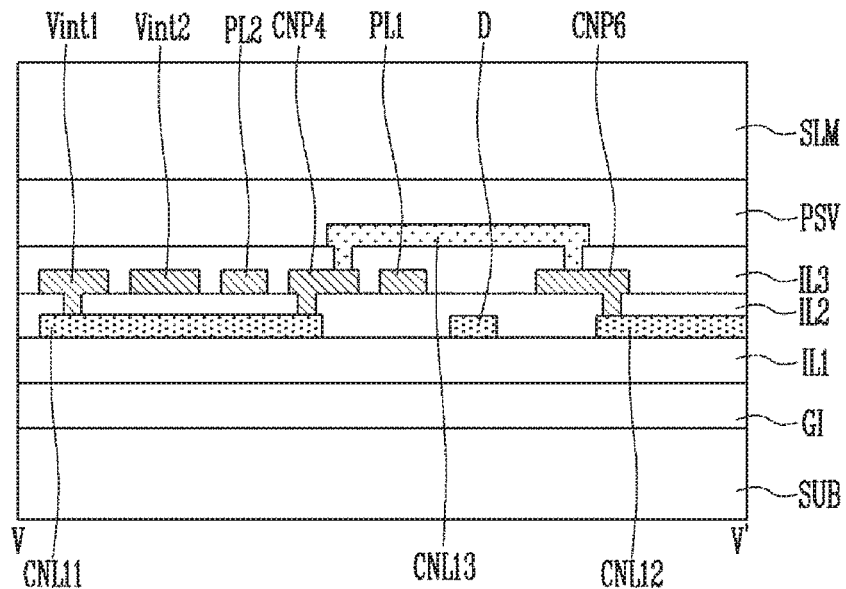
FIG. 12 is a cross-sectional view taken along line V-V' of FIG. 9.
Figure 13:
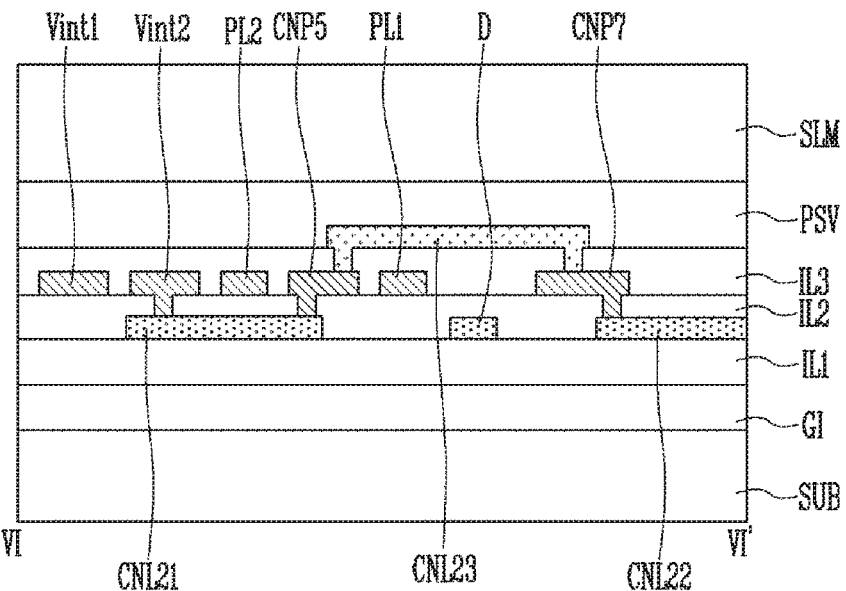
FIG. 13 is a cross-sectional view taken along line VI-VI' of FIG. 9.
Figure 14:
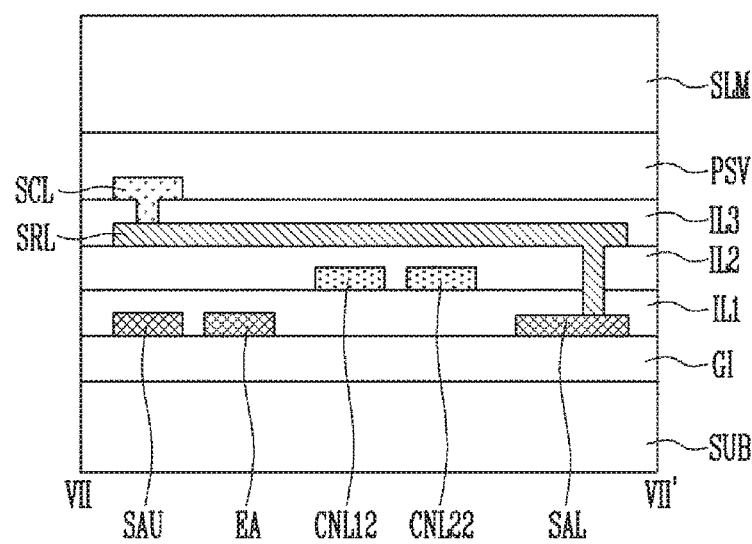
FIG. 14 is a cross-sectional view taken along line VII-VII' of FIG. 9.

FIG. 9 is a top plan view conceptually illustrating a part corresponding to P2 of FIG. 3, FIG. 10 is a cross-sectional view taken along line of FIG. 9, FIG. 11 is a cross-sectional view taken along line IV-IV' of FIG. 9, FIG. 12 is a cross-sectional view taken along line V-V' of FIG. 9, FIG. 13 is a cross-sectional view taken along line VI-VI' of FIG. 9, and FIG. 14 is a cross-sectional view taken along line VII-VII' of FIG. 9.

FIGS. 9 to 14 illustrate a connection relation between the respective lines in detail. For convenience of the description, FIGS. 9 to 14 illustrate mainly a scan line, an emission control line, a first initialization power line, and a second initialization power line connected to one pixel row of a second pixel area.

Referring to FIGS. 9 to 14, a scan line may be extended in the first direction DR1 in the pixel area PXA, and may be extended in the first direction DR1 even in the peripheral area PPA. However, the scan line may be bent in a direction inclined with respect to the first direction DR1 and then extended in the first direction DR1 according to a position in the peripheral area PPA corresponding to the second pixel area PXA2. FIG. 9 illustrates a case in which the scan line is bent in the direction inclined with respect to the first direction DR1 in the peripheral area PPA as an example.

The scan line may include a scan driving connecting unit SP connected to a scan driver, a first pixel connecting unit SAU connected to a pixel row and providing a scan signal to the pixel row, a scan line connecting unit SCL connecting the scan driving connecting unit SP and the first pixel connecting unit SAU, an another pixel connecting unit SAL connected with the first pixel connecting unit SAU and providing an initialization signal to another pixel row, and a signal connecting unit SRL connecting the first pixel connecting unit SAU and the another pixel connecting unit SAL.

The scan driving connecting unit SP may be disposed on the first interlayer insulating layer IL1, and may be electrically connected to the scan line connecting unit SCL. That is, the scan driving connecting unit SP may be disposed on the same layer as that of the upper electrode UE of the storage capacitor of the pixel PXL illustrated in FIGS. 6 to 8, and may include the same material as that of the storage capacitor. Here, the scan driver SP may be electrically connected to the scanline connecting unit SCL through a first contact pad CNP1 disposed on the second interlayer insulating layer IL2.

The first pixel connecting unit SAU and the another pixel connecting unit SAL may be disposed on the gate insulating layer GI, and may be electrically connected to the scan line connecting unit SCL through the signal connecting unit SRL. That is, the first pixel connecting unit SAU and the another pixel connecting unit SAL may be disposed on the same layer as those of the emission control line Ei and the scan lines Si-1, SiU, and SiL of the pixel illustrated in FIGS. 6 to 8, and may have the same material as those of the emission control line Ei, the upper electrode UE of the storage capacitor, and the scan lines Si-1, SiU, and SiL.

The scan line connecting unit SCL may be disposed on the third interlayer insulating layer IL3. That is, the scan line connecting unit SCL may be disposed on the same layer as those of the second bridge pattern BRP2 and the power line PL, and may include the same material as that of the second bridge pattern BRP2.

The signal connecting unit SRL may be disposed on the second interlayer insulating layer IL2. That is, the signal connecting unit SRL may be disposed on the same layer as those of the data line Dj, the first bridge pattern BRP1, and the auxiliary connection line AUX illustrated in FIGS. 6 to 8, and may include the same material as those of the data line Dj, the first bridge pattern BRP1, and the auxiliary connection line AUX.

The emission control line may include an emission driving connecting unit EP connected to the emission driver, a second pixel connecting unit EA connected to the pixel row and providing an emission control signal, and an emission control line connecting unit ECL connecting the emission driving connecting unit EP and the second pixel connecting unit EA.

The emission driving connecting unit EP may be disposed on the gate insulating layer GI, and may be electrically connected to the emission control line connecting unit ECL through a second contact pad CNP2 disposed on the second interlayer insulating layer IL2. That is, the emission driving connecting unit EP may be disposed on the same layer as those of the first pixel connecting unit SAU and the another pixel connecting unit SAL, and may include the same material as those of the first pixel connecting unit SAU and the another pixel connecting unit SAL.

The second pixel connecting unit EA may be disposed on the gate insulating layer GI, and may be electrically connected to the emission control line connecting unit ECL through a third contact pad CNP3 disposed on the second interlayer insulating layer IL2. That is, the second pixel connecting unit EA may be disposed on the same layer as that of the emission driving connecting unit EP, and may include the same material as that of the emission driving connecting unit EP.

The emission control line connecting unit ECL may be disposed on the third interlayer insulating layer IL3. That is, the emission control line connecting unit ECL may be disposed on the same layer as that of the scan line connecting unit SCL, and may include the same material as that of the scan line connecting unit SCL.

The first initialization power line Vint1 and the second initialization power line Vint2 may be disposed on the second interlayer insulating layer IL2. The first initialization power line Vint1 and the second initialization power line Vint2 may provide a first initialization power source and a second initialization power source to the pixel, respectively, through the plurality of lines. For example, the first initialization power line Vint1 and the second initialization power line Vint2 may provide the first initialization power source and the second initialization power source to the pixel, respectively, through first connection lines CNL11 and CNL21 connected to the first initialization power line Vint1 and the second initialization power line Vint2, second connection lines CNL12 and CNL22 connected to the pixel, and third connection lines CNL13 and CNL23 connecting the first connection lines CNL11 and CNL21 and the second connection lines CNL12 and CNL22.

The first connection lines CNL11 and CNL21 may be disposed on the first interlayer insulating layer IL1, and may be electrically connected to the third connection lines CNL13 and CNL23 through a fourth contact pad CNP4 and a fifth contact pad CNP5 disposed on the second interlayer insulating layer IL2. Further, the second connection lines CNL12 and CNL22 may be disposed on the first interlayer insulating layer IL1, and may be electrically connected to the third connection lines CNL13 and CNL23 through a sixth contact pad CNP6 and a seventh contact pad CNP7 disposed on the second interlayer insulating layer IL2. That is, the first connection lines CNL11 and CNL21 and the second connection lines CNL12 and CNL22 may be disposed on the same layer as that of the scan driving connecting unit SP and may include the same material as that of the scan driving connecting unit SP.

The third connection lines CNL13 and CNL23 may be disposed on the third interlayer insulating layer IL3. That is, the third connection lines CNL13 and CNL23 may be disposed on the same layer as that of the scan line connecting unit SCL, and may include the same material as that of the scan line connecting unit SCL.

In the exemplary embodiment of the present disclosure, the scan line connecting unit SCL, the emission control line connecting unit ECL, and the third connection lines CNL13 and CNL23 may cross the data line D and the first power line PL1 of the pixel (hereinafter, referred to as a "leading pixel") that is most adjacent to the second power line PL2 of the pixel row, for example, the $i-1^{th}$ pixel row, which is more adjacent to the first pixel area than the $i^{th}$ pixel row.

Accordingly, the contact hole connecting the scan line connecting unit SCL of the scan line and the another pixel connecting unit SAL may be disposed between the pixel connected to the scan line and the data line D of the leading pixel of the $i-1^{th}$ pixel row. Here, the contact hole connecting the scan line connecting unit SCL of the scan line and the another pixel connecting unit SAL may be a branched point BP of the pixel connecting unit SAU of the scan line and the another pixel connecting unit SAL.

The above detailed description exemplifies and describes the present invention. Further, the aforementioned contents simply represent and describe the exemplary embodiment of the present disclosure. The present disclosure may be used in various other combinations, changes, and environments as described above, and may be changed or modified within the scope of the concept of the invention disclosed in the present specification, the scope equivalent to the disclosed contents, and/or the scope of the technology or knowledge in the art. Accordingly, the detailed description of the invention does not intend to limit the present disclosure to the disclosed exemplary embodiment. Further, it should be construed that the accompanying claims include other exemplary embodiments.

What is claimed is:

1. A display device, comprising:
    a substrate including a pixel area and a peripheral area;
    pixels provided in the pixel area of the substrate, and disposed in a plurality of pixel rows and a plurality of pixel columns;
    data lines configured to provide a data signal to the pixel columns;
    scan lines configured to provide a scan signal to the pixel rows;
    emission control lines configured to provide an emission control signal to the pixel rows;
    first power lines configured to provide a power source to the pixel columns; and
    a second power line electrically connected to the first power lines and disposed in the peripheral area,
    wherein a scan line connected to an $i^{th}$ pixel row (i is a natural number) applies a scan signal to the $i^{th}$ pixel row, and a branched line branched from the scan line applies an initialization signal to a $k^{th}$ pixel row (k is a natural number, and k≠i),
    wherein a branched point of the scan line is disposed between the second power line and a leading pixel of the $i^{th}$ pixel row in a direction parallel to the pixel rows, and wherein the leading pixel of the $i^{th}$ pixel row is most adjacent to the second power line among pixels of the $i^{th}$ pixel row.

2. The display device of claim 1, wherein the $k^{th}$ pixel row, to which the scan line applies the initialization signal, is an $i+1^{th}$ pixel row.

3. The display device of claim 1, wherein the pixel area includes a first pixel area and a second pixel area disposed on at least one side of the first pixel area.

4. The display device of claim 3, wherein a width of a portion of the second pixel area decreases as the distance between the portion of second pixel area and the first pixel area increases.

5. The display device of claim 4, wherein in the second pixel area, the branched point of the scan line connected to an $l^{th}$ pixel row (l is a natural number) is disposed between a data line connected to a leading pixel of a pixel row different from the $l^{th}$ pixel row and a leading pixel of the $l^{th}$ pixel row.

6. The display device of claim 5, wherein the different pixel row is more adjacent to the first pixel area than the $l^{th}$ pixel row.

7. The display device of claim 5, further comprising:
    a scan driver provided in the peripheral area and connected to ends of the scan lines; and
    an emission driver provided in the peripheral area and connected to ends of the emission control lines,
    wherein the scan driver is disposed between the emission driver and the pixel area.

8. The display device of claim 7, further comprising:
    a first initialization power line provided in the peripheral area and configured to provide a first initialization power source to the pixel rows; and
    a second initialization power line provided in the peripheral area and configured to provide a second initialization power source to the pixel rows.

9. The display device of claim 8, wherein the first initialization power line and the second initialization power line are disposed between the scan driver and the pixel area.

10. The display device of claim 8, wherein a voltage of a power source applied to the first initialization power line is higher than a voltage of a power source applied to the second initialization power line.

11. The display device of claim 10, wherein the pixel includes an emitting device including an anode electrode, a cathode electrode, and an emission layer disposed between the anode electrode and the cathode electrode, and
    the voltage of the power source applied to the second initialization power line is higher than a voltage of a power source applied to the cathode electrode.

12. The display device of claim 10, wherein the voltage of the power source applied to the first initialization power line is lower than a voltage of the data signal applied to the data lines.

13. The display device of claim 3, wherein in the first pixel area, lengths of branched lines branched from the scan lines are the same.

14. The display device of claim 13, wherein in the second pixel area, a length of the branched line branched from the scan line connected to at least a part of the pixel rows is different from a length of a branched line branched from a scan line of another pixel row.

* * * * *